United States Patent
Hatano et al.

(10) Patent No.: US 9,633,871 B2
(45) Date of Patent: Apr. 25, 2017

(54) LIGHT-EMITTING DEVICE

(75) Inventors: Kaoru Hatano, Kanagawa (JP); Yusuke Nishido, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 554 days.

(21) Appl. No.: 13/588,605

(22) Filed: Aug. 17, 2012

(65) Prior Publication Data

US 2013/0049062 A1 Feb. 28, 2013

(30) Foreign Application Priority Data

Aug. 24, 2011 (JP) ................................. 2011-182642

(51) Int. Cl.
| | |
|---|---|
| *H01L 31/12* | (2006.01) |
| *H01L 27/32* | (2006.01) |
| *H01L 33/00* | (2010.01) |
| *H01L 21/50* | (2006.01) |
| *H01L 51/52* | (2006.01) |
| *H01L 23/10* | (2006.01) |

(52) U.S. Cl.
CPC .......... *H01L 21/50* (2013.01); *H01L 27/3276* (2013.01); *H01L 51/5246* (2013.01); *H01L 23/10* (2013.01); *H01L 27/3279* (2013.01); *H01L 2924/0002* (2013.01)

(58) Field of Classification Search
CPC ......... H01L 31/12; H01L 27/32; H01L 33/00; H01L 33/08; H01L 27/15; H01L 51/50
See application file for complete search history.

(56) References Cited

U.S. PATENT DOCUMENTS

| | | | |
|---|---|---|---|
| 6,646,284 B2 | 11/2003 | Yamazaki et al. | |
| 6,998,776 B2 | 2/2006 | Aitken et al. | |
| 7,385,347 B2 | 6/2008 | Song et al. | |
| 7,431,628 B2 | 10/2008 | Park et al. | |
| 7,701,136 B2 | 4/2010 | Kwak | |
| 7,780,493 B2 | 8/2010 | Choi et al. | |
| 7,837,530 B2 | 11/2010 | Park | |
| 7,841,919 B2 | 11/2010 | Lee et al. | |
| 7,863,207 B2 | 1/2011 | Son et al. | |
| 7,871,949 B2 | 1/2011 | Lee et al. | |
| 7,944,143 B2 | 5/2011 | Choi et al. | |
| 7,994,534 B2 | 8/2011 | Kim et al. | |
| 8,026,511 B2 | 9/2011 | Choi et al. | |
| 8,125,146 B2 | 2/2012 | Park | |
| 8,164,257 B2 | 4/2012 | Choi et al. | |
| 8,192,188 B2 | 6/2012 | Kim | |
| 8,368,302 B2 | 2/2013 | Kang et al. | |
| 2002/0043364 A1* | 4/2002 | Suzuki ..................... | B22F 7/06 165/185 |
| 2005/0168129 A1 | 8/2005 | Chi | |
| 2007/0128965 A1* | 6/2007 | Burt et al. ..................... | 445/25 |
| 2007/0170455 A1 | 7/2007 | Choi et al. | |
| 2007/0190691 A1* | 8/2007 | Humpston et al. ........... | 438/113 |

(Continued)

FOREIGN PATENT DOCUMENTS

| | | |
|---|---|---|
| CN | 101009310 A | 8/2007 |
| EP | 1 814 161 A2 | 8/2007 |

(Continued)

OTHER PUBLICATIONS

Taiwanese Office Action re Application No. TW 101129383, dated Apr. 26, 2016.

*Primary Examiner* — Mohammad Choudhry
(74) *Attorney, Agent, or Firm* — Husch Blackwell LLP

(57) ABSTRACT

To provide a highly reliable light-emitting device with less occurrence of cracks in a sealant bonding two facing substrates together. In a light-emitting device, a first substrate including a light-emitting unit, and a second substrate are bonded to each other with glass frit. A wiring in the area overlapping with a sealing material formed by melting and solidifying glass frit may be formed of a conductive material having a linear thermal expansion coefficient close to that of a substrate material. More specifically, the difference in the linear thermal expansion coefficient between the conductive material and the substrate material is 5 ppm/K or less at a temperature of 0° C. to 500° C.

19 Claims, 9 Drawing Sheets

(56) References Cited

U.S. PATENT DOCUMENTS

| | | |
|---|---|---|
| 2007/0200489 A1 | 8/2007 | Poon et al. |
| 2008/0206925 A1* | 8/2008 | Chatterjee et al. ........... 438/106 |
| 2009/0058293 A1 | 3/2009 | Maeda |
| 2010/0079065 A1 | 4/2010 | Kamiura |

FOREIGN PATENT DOCUMENTS

| | | |
|---|---|---|
| EP | 1 814 175 A2 | 8/2007 |
| EP | 1 818 997 A2 | 8/2007 |
| JP | 2000-243556 A | 9/2000 |
| JP | 2002-203686 A | 7/2002 |
| JP | 2005-215681 | 8/2005 |
| JP | 2007-200856 A | 8/2007 |
| JP | 2007-200890 | 8/2007 |
| JP | 2007-220647 A | 8/2007 |
| JP | 2009-076437 A | 4/2009 |
| JP | 2010-80339 | 4/2010 |
| JP | 2010-80341 | 4/2010 |
| JP | 2011-028210 A | 2/2011 |
| JP | 2011-65895 | 3/2011 |
| JP | 2011-70797 | 4/2011 |
| TW | 200733447 | 9/2007 |
| TW | I364109 B | 5/2012 |
| WO | WO 2007/089406 A2 | 8/2007 |

* cited by examiner

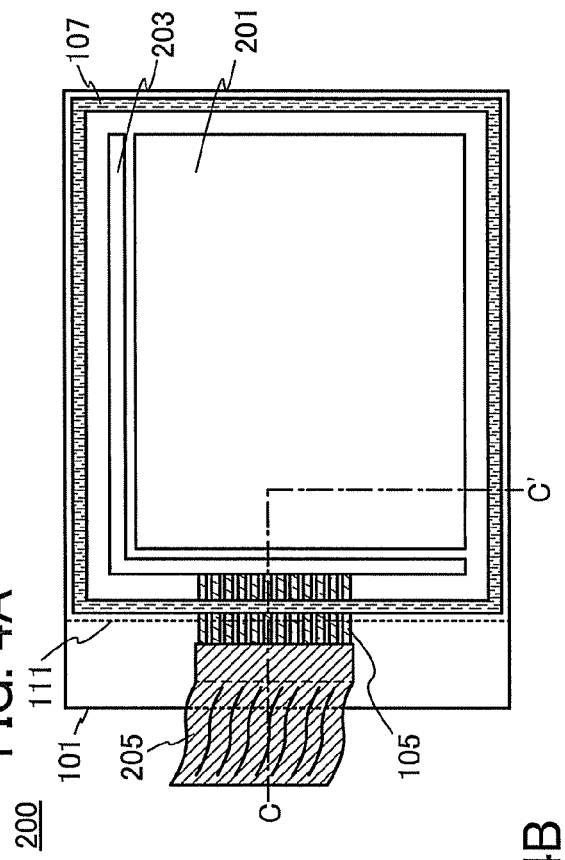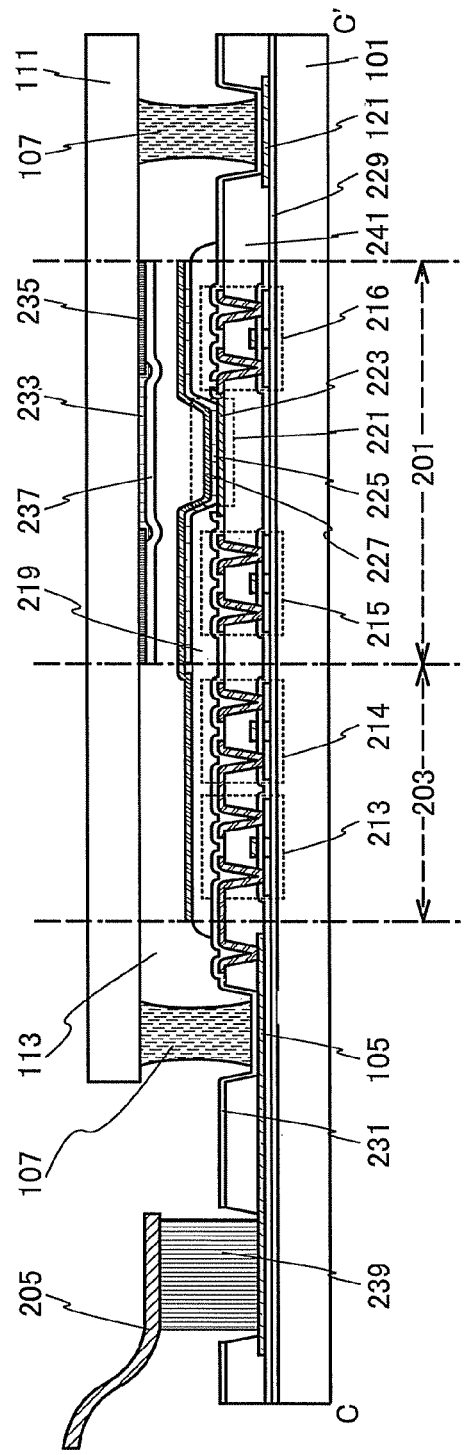
FIG. 4A
FIG. 4B

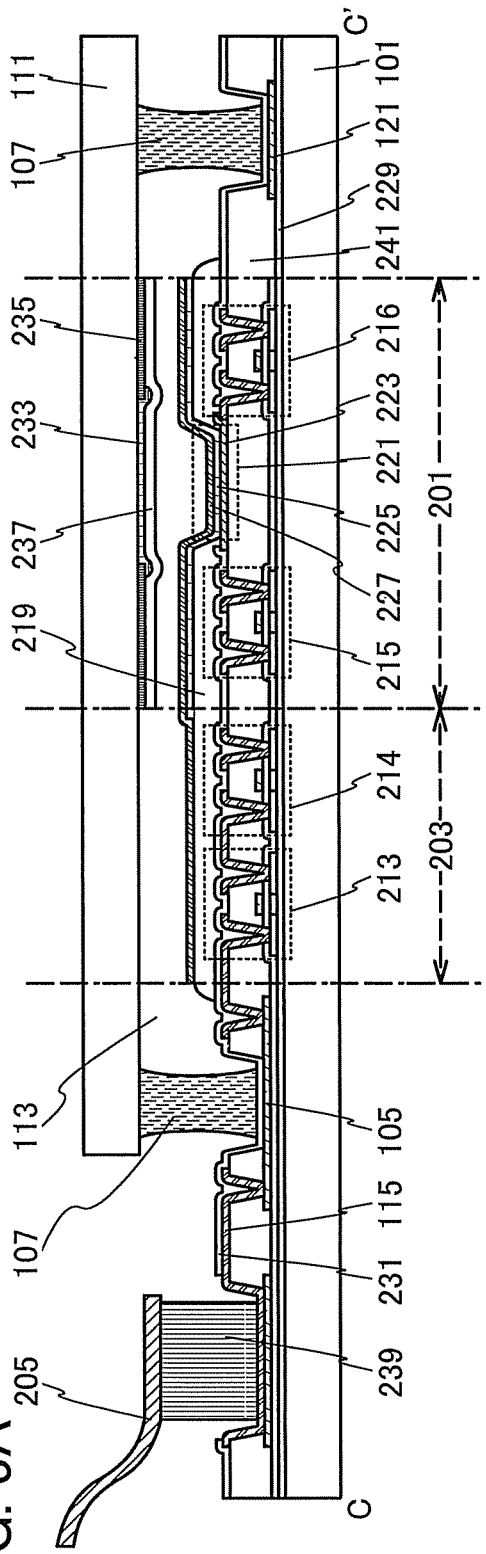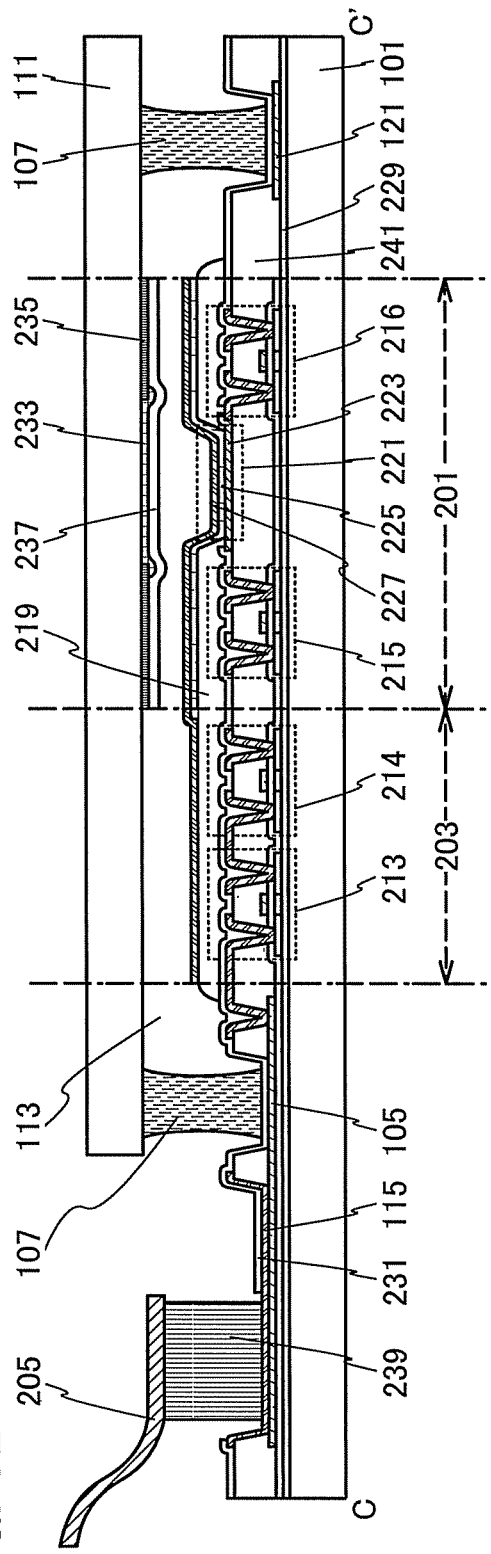

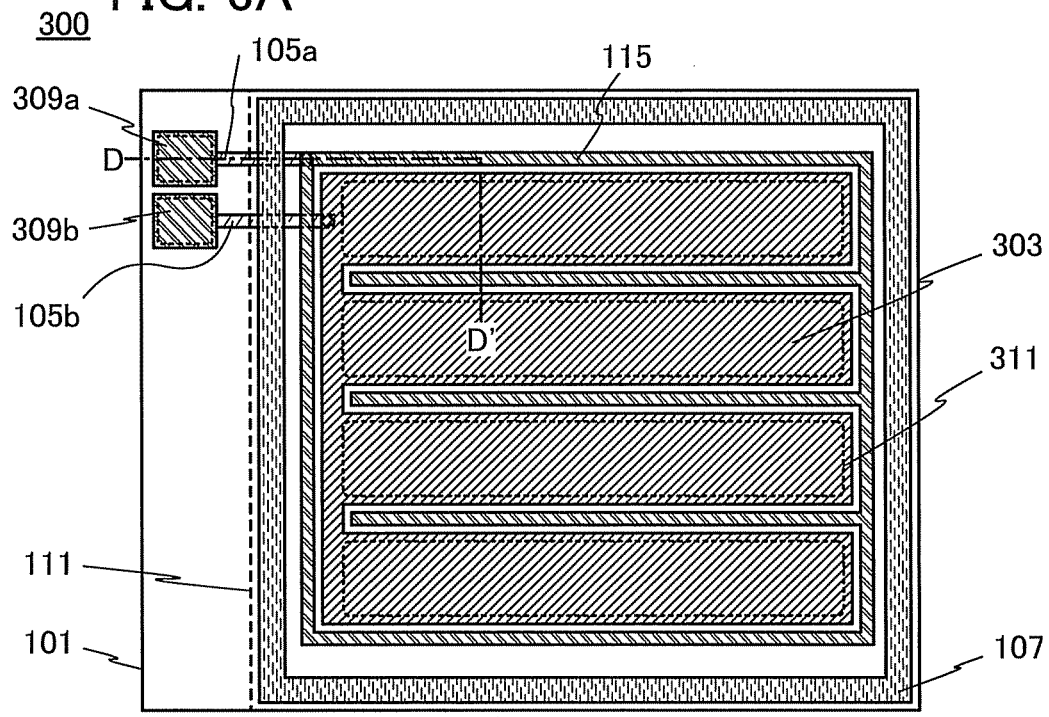
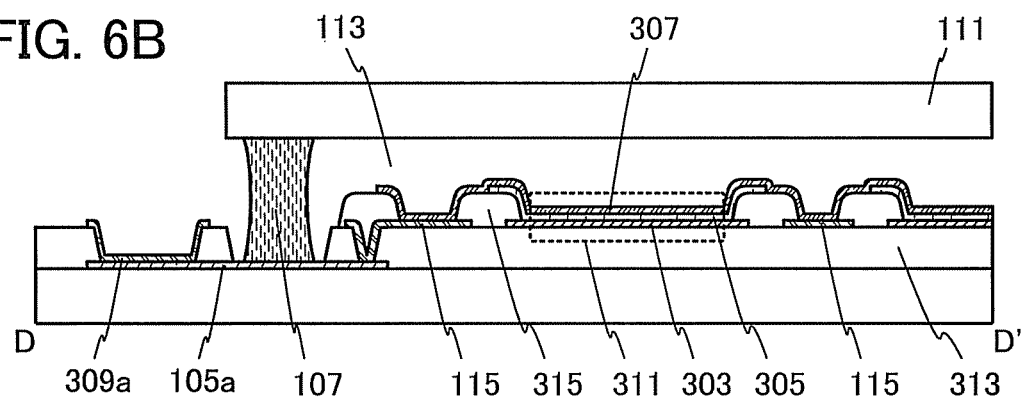

LIGHT-EMITTING DEVICE

BACKGROUND OF THE INVENTION

1. Field of the Invention

The present invention relates to a light-emitting device. In particular, the invention relates to a light-emitting device using an organic EL element.

2. Description of the Related Art

Organic EL (Electro Luminescence) elements have been actively researched and developed. The basic structure of the organic EL element is as follows: a layer containing a light-emitting organic compound is interposed between a pair of electrodes; and light emission can be obtained from the light-emitting organic compound when voltage is applied to the element.

The light-emitting device using an organic EL element is, for example; a lighting device, or an image display device including a thin film transistor. The organic EL element can be formed in a film shape and thus easily increased in area, which allows a lighting device with a planar light source to be realized. In addition, an image display device using an organic EL element needs no backlight which is necessary for liquid crystal display devices and the like; therefore, thin, lightweight, high contrast, and low power consumption display devices can be obtained.

It is known that when the organic EL element is exposed to the air (including moisture, oxygen, and the like), its performance degrades rapidly. It is thus required that the organic EL element be hermetically sealed with a material having a high gas barrier property so as not to be exposed to the air.

A sealing technique using glass frit including low-melting-point glass is known as a technique that realizes sealing with a high gas barrier property. The technique disclosed in Patent Document 1 is as follows: a paste containing a binder and a frit material including low-melting-point glass is applied to the edge of a glass substrate; the binder is removed through prebaking; and the glass frit is irradiated with laser light while a counter glass substrate is provided over the glass substrate, whereby the glass frit is melted and the substrates are bonded to each other and sealed with the glass frit. When a device using an organic EL element is sealed with such glass frit, the organic EL element can be isolated from the external air and a light-emitting device with high reliability can be realized.

REFERENCE

Patent Document

[Patent Document 1] Japanese Published Patent Application No. 2011-65895

SUMMARY OF THE INVENTION

In the case where glass frit after prebaking is heated by laser irradiation, the glass frit is rapidly heated and cooled, so that a sealing material is obtained from the melted and solidified glass frit, and a stress is generated in the sealing material. In addition, an external stress is applied to the sealing material from a body to be bonded such as a substrate. Such a stress applied to the sealing material causes cracks in the sealing material itself or the body to be bonded such as a substrate, leading to loss of hermeticity.

Occurrence of such cracks due to stress can be prevented by selecting the frit material in accordance with the material of a substrate.

In the case where a structure is provided in a part of an area overlapping with a sealing material, however, a different level of stress is applied to the sealing material in that area in some cases. For example, when a wiring or the like is led out from a region sealed with the sealing material (hereinafter, also referred to as a sealed region), the level of stress applied to the area overlapping with the wiring is different from that applied to the other region, which causes cracks in the sealing material, a layer overlapping with the sealing material, a substrate, and the like. In that case, it is difficult to optimize the material of the frit material, and occurrence of cracks cannot be prevented easily.

The present invention is made in view of the foregoing technical background. One object of an embodiment of the present invention is to provide a highly reliable light-emitting device with less occurrence of cracks.

In order to solve the above problems, in the present invention, attention has been focused on the difference in the linear thermal expansion coefficient between different materials, which is a cause of stress. In a light-emitting device, a wiring in the area overlapping with a sealing material may be formed of a conductive material having a linear thermal expansion coefficient close to that of a substrate material.

More specifically, the difference in the linear thermal expansion coefficient between the conductive material of the wiring and the substrate material is 5 ppm/K or less, preferably 2 ppm/K or less at a temperature of 0° C. to 500° C.

A light-emitting device of one embodiment of the present invention includes a first substrate, a second substrate facing the first substrate, and a sealing material containing glass. The first substrate includes a light-emitting unit, and a wiring electrically connected to the light-emitting unit. The light-emitting unit is provided in, a sealed region surrounded by the first substrate, the second substrate, and the sealing material. The wiring extends to the outside of the sealed region and partly overlaps with the sealing material. The difference in the linear thermal expansion coefficient between a conductive material of the wiring and a material of the first substrate is 5 ppm/K or less at a temperature of 0° C. to 500° C.

A conductive material having such a linear thermal expansion coefficient is used for a wiring in the area overlapping with a sealing material formed by melting and solidifying glass frit. Thus, the stress applied to the sealing material in the area overlapping with the wiring can be reduced and occurrence of cracks can be prevented.

A light-emitting device of another embodiment of the present invention includes a first substrate, a second substrate facing the first substrate, and a sealing material containing glass. The first substrate includes a light-emitting unit, and a wiring electrically connected to the light-emitting unit. The light-emitting unit is provided in a sealed region surrounded by the first substrate, the second substrate, and the sealing material. The wiring extends to the outside of the sealed region and partly overlaps with the sealing material. The difference in the linear thermal expansion coefficient between a conductive material of the wiring and a material of the first substrate is 2 ppm/K or less at a temperature of 0° C. to 500° C.

By using such a conductive material having a linear thermal expansion coefficient very close to that of the substrate material, the stress applied to the sealing material in the area overlapping with the wiring can be reduced to the level almost equal to that in the area that does not overlap with the wiring. Accordingly, occurrence of cracks can be prevented more effectively.

In the light-emitting device of an embodiment of the present invention, the conductive material is tungsten.

In particular, tungsten (W) is preferably used as the conductive material for the wiring. Tungsten has a linear thermal expansion coefficient close to that of a glass material, particularly a non-alkali glass, which is suitable for a glass substrate preferably used in a sealing method using glass frit. Thus, occurrence of cracks can be prevented effectively. Furthermore, tungsten has a relatively low resistivity, so that wiring resistance can be reduced. In addition, tungsten is a high melting point material and has extremely high heat resistance to heat generated in a laser irradiation process. Moreover, tungsten is a material often used in semiconductor technology and for example, can be used as a conductive material of thin film transistors; therefore, in a display device including thin film transistors, the wiring can be formed in the manufacturing process of the thin film transistors.

In the light-emitting device of an embodiment of the present invention, an oxide layer in contact with the sealing material is provided between the wiring and the sealing material.

In order to increase adhesion, the oxide layer in contact with the sealing material is preferably provided between the sealing material and the wiring.

In the light-emitting device of an embodiment of the present invention, a buffer layer made of the aforementioned conductive material is provided to overlap with the sealing material.

A buffer layer made of the same conductive material as the wiring is provided in the area overlapping with the sealing material on which the wiring is not provided. Accordingly, laser irradiation can be performed under the same conditions, resulting in simplification of the process.

In the light-emitting device of an embodiment of the present invention, the light-emitting unit includes a layer containing a light-emitting organic compound, which is provided between a pair of electrodes.

In the light-emitting device of an embodiment of the present invention, the light-emitting unit includes a layer containing a light-emitting organic compound, which is provided between a pair of electrodes, and a thin film transistor.

As mentioned above, in the light-emitting device of an embodiment of the present invention, occurrence of cracks can be prevented and hermetic sealing is achieved. Therefore, a light-emitting unit including an organic EL element is preferably used for the light-emitting device. Examples of the light-emitting device including the light-emitting unit are a lighting device using an organic EL element as a light source, and a display device using an organic EL element in combination with a thin film transistor.

Particularly in the display device using an organic EL element in combination with a thin film transistor, the thin film transistor can be provided in a hermetically sealed region, resulting in increased reliability. As a result, a display device with extremely high reliability can be obtained.

Note that in this specification and the like, an EL layer refers to a layer provided between a pair of electrodes of a light-emitting element, and specifically refers to at least a layer containing a light-emitting organic compound (also referred to as a light-emitting layer), or a stack including the light-emitting layer.

Note that in this specification, a light-emitting device includes an image display device fixated over a substrate, or a light-emitting unit such as a light source. Accordingly, a display device including an image display device, a lighting device including a light source, or the like is an embodiment of the light-emitting device. The light-emitting device also includes the following in its category: a module in which a connector such as an FPC (flexible printed circuit), a TAB (tape automated bonding) tape, or a TCP (tape carrier package) is attached to a light-emitting device; a module in which the tip of a TAB tape or a TCP is provided with a printed wiring board; and a module in which an IC (integrated circuit) is directly mounted on a substrate including a light-emitting element by a COG (chip on glass) method.

According to the present invention, a highly reliable light-emitting device with less occurrence of cracks can be provided.

BRIEF DESCRIPTION OF THE DRAWINGS

In the accompanying drawings:

FIGS. 4A and 4B illustrate a display device of an embodiment of the present invention;

FIGS. 5A and 5B illustrate a display device of an embodiment of the present invention;

FIGS. 6A and 6B illustrate a lighting device of an embodiment of the present invention;

DETAILED DESCRIPTION OF THE INVENTION

Figure 1A:
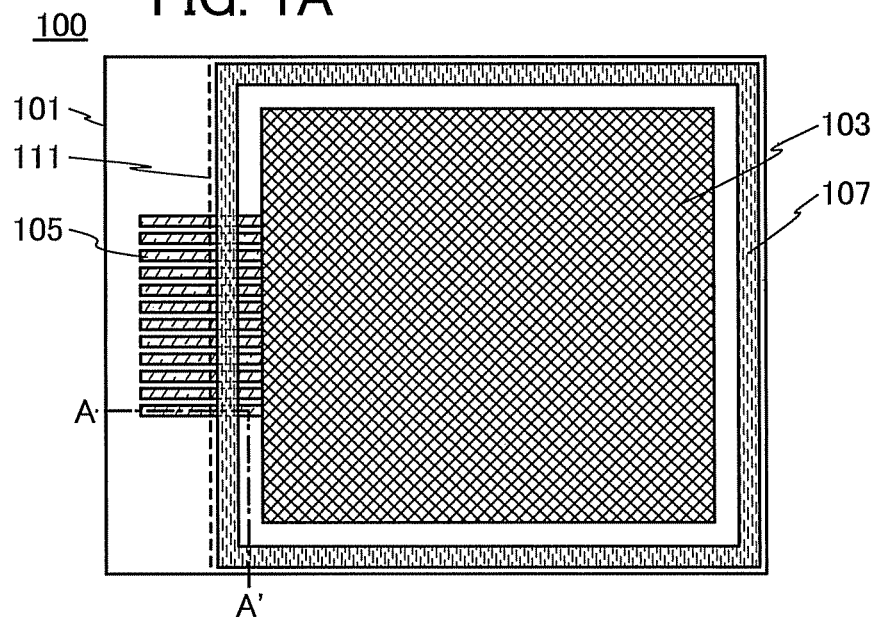
FIGS. 1A to 1C illustrate a light-emitting device of an embodiment of the present invention.

Embodiments of the present invention will be described in detail with reference to drawings. Note that the present invention is not limited to the following description, and it is apparent to those skilled in the art that modes and details can be modified in a wide variety of ways without departing from the spirit and scope of the present invention. Therefore, the present invention is not interpreted as being limited to the description of the embodiments below. Note that in the structures of the invention described below, the same parts or parts having a similar function are denoted with the same reference numerals in different drawings, and the description thereof is not repeated.

Note that in each drawing shown in this specification, the size of each component, the thickness of a layer, or a region is exaggerated in some cases for clarity. Accordingly, the present invention is not always limited to the scale.

Embodiment 1

In this embodiment, examples of the structure of the light-emitting device of an embodiment of the present invention will be described with reference to FIGS. 1A to 1C, FIGS. 2A to 2D, and FIGS. 3A to 3C.

<Example of Structure>

Figure 1B:
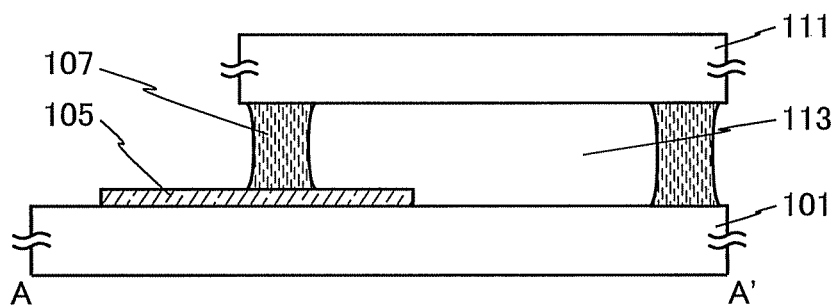

FIG. 1A is a schematic top view of a light-emitting device 100 shown in this embodiment. FIG. 1B is a schematic cross-sectional view along line A-A' of FIG. 1A.

In the light-emitting device 100, a first substrate 101 and a second substrate 111 are bonded to each other to be sealed with a sealing material 107 along the edge of the second substrate 111. Accordingly, the light-emitting device 100 includes a hermetically sealed region 113 which is surrounded by the first substrate 101, the second substrate 111, and the sealing material 107.

The light-emitting device 100 includes a light-emitting unit 103 in the sealed region 113. As the light-emitting unit 103, an image display device using an organic EL element, a light source, or the like can be used. Examples of the structure of the light-emitting unit 103 will be described in the following embodiment.

A wiring 105 is provided over the first substrate 101. The wiring 105 is electrically connected to the light-emitting unit 103 and extends from the sealed region 113 to the outside of the sealed region 113. Through the wiring 105, a power source potential, a common potential, and an electric signal such as a driving signal for driving the light-emitting unit 103, are input from the outside. The wiring 105 partly overlaps with the sealing material 107.

The first substrate 101 and the second substrate 111 are made of a material having heat resistance to a temperature at which the sealing material 107 is formed. A light-transmitting material is used for the substrate through which light is emitted from the light-emitting unit 103. A glass substrate is preferably used for either or both the first substrate 101 and the second substrate 111. In particular, in the case where the light-emitting unit 103 includes a semiconductor element such as a thin film transistor, it is preferable to use a non-alkali glass which prevents diffusion of impurities degrading the performance of the semiconductor element.

The sealing material 107 contains a glass material and is obtained by melting and solidifying glass frit. The thus formed sealing material 107 has an extremely high gas barrier property, which allows the hermetically sealed region 113 to be formed. An optimum material is selected as the glass material for the sealing material 107, in consideration of the upper temperature limit of the first substrate 101 and the second substrate 111, the linear thermal expansion coefficient of the substrates in the temperature range at which the sealing material 107 is formed, and the like. The glass material used for the sealing material 107 preferably contains one or more compounds selected from, for example, the following group: magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass.

The sealing material 107 is formed in the following manner. A frit paste, in which a frit material containing powder glass of any of the aforementioned materials is mixed with a binder made of, for example, a resin diluted with an organic solvent, is applied on the first substrate 101 or the second substrate 111 by a screen printing method, a dispensing method, or the like. Then, prebaking is performed to remove the organic solvent and the binder in the frit paste. After that, the two substrates are bonded to each other so that the frit paste from which the organic solvent and the binder have been removed is in contact with the counter substrate, and welded to each other by irradiating the frit paste with laser light, whereby the sealing material 107 can be obtained. Note that a component in the organic solvent or the binder, a thermally modified component therein, or the like remains in the sealing material 107 in some cases.

In the laser irradiation, the inside of the sealed region 113 is preferably brought into an inert gas atmosphere or a reduced pressure atmosphere. For example, before the laser irradiation, a sealant such as an ultraviolet curable resin or a thermosetting resin is formed in advance outside or inside the area where the frit paste is applied; then, the two substrates are temporarily bonded to each other with the sealant in an inert gas atmosphere or a reduced pressure atmosphere. Subsequently, laser irradiation is performed in an air atmosphere or an inert gas atmosphere, whereby the sealing material 107 is formed. When the sealant is provided to be a closed curve, the structure of an apparatus can be simplified because the inside of the sealed region 113 is kept in an inert gas atmosphere or a reduced pressure atmosphere and the laser irradiation can be performed in an air atmosphere. Further, when the inside of the sealed region 113 is brought into a reduced pressure atmosphere in advance, the laser irradiation can be performed while the substrates facing the frit paste are in close contact with each other due to a pressure difference, and a mechanism such as a clamp for pressing the two substrates is not needed.

When the sealing material 107 is formed by laser irradiation, the sealing material 107 is instantaneously heated to a high temperature which allows welding of the sealing material 107 and a surface to be bonded. At this time, the first substrate 101, the second substrate 111, the wiring 105, and the like in the vicinity of the sealing material 107 are also heated to a high temperature. The wiring 105 in the area overlapping with the sealing material 107 is heated to, for example, 200° C. to 500° C., and in some cases, heated to a temperature as high as 200° C. to 800° C., though it depends on the material of the sealing material 107, laser irradiation conditions, heat conductivity and heat capacity in the vicinity of the area irradiated with the laser light, and the like.

The wiring 105 is made of a conductive material having a linear thermal expansion coefficient close to that of the material of the first substrate 101 over which the wiring 105 is provided. More specifically, the difference in the linear thermal expansion coefficient between the conductive material and the material of the substrate is 5 ppm/K or less, preferably 2 ppm/K or less at least in the range of 0° C. to 500° C.

As the conductive material of the wiring 105, a material with relatively low electrical resistivity may be selected in accordance with the linear thermal expansion coefficient of the material of the substrate to be used. For example, in the case where glass is used for the substrate, the wiring 105 can be made of a conductive material such as molybdenum, titanium, iridium chromium, tantalum, platinum, vanadium, or rhodium.

The wiring 105 can be formed using a single layer or stacked layers of a conductive film including any of the aforementioned conductive materials. Alternatively, the wiring 105 may be fainted using an alloy film containing any of the aforementioned conductive materials as its main component (for example, 50% or more in content).

The conductive material of the wiring 105 is selected so that the difference in the linear thermal expansion coefficient between the conductive material and the material of the substrate is 5 ppm/K or less, resulting in a reduction in the stress applied to the sealing material 107 in the area overlapping with the wiring 105. Furthermore, in the case where the difference in the linear thermal expansion coefficient between the conductive material and the material of the substrate is as small as 2 ppm/K or less, the stress can be reduced to the level almost equal to that in the area that does not overlap with the wiring 105. Accordingly, even in the case of using the sealing material 107 selected in accordance with the material of the substrate, occurrence of cracks due to stress in the area overlapping with the wiring 105 can be prevented effectively.

Further, since the linear thermal expansion coefficient of the conductive material used for the wiring 105 is close to that of the first substrate 101, even when the wiring 105 or the first substrate 101 is heated in the laser irradiation process, it is possible to effectively reduce defects, such as occurrence of cracks or peeling at the interface, which are caused by the difference in the linear thermal expansion coefficient between the wiring 105 and the first substrate 101.

As the conductive material of the wiring 105, tungsten (W) is preferably used. Tungsten has a linear thermal expansion coefficient close to that of a glass material, particularly the aforementioned non-alkali glass, which is suitable for a glass substrate preferably used in a sealing method using glass frit. Furthermore, since tungsten has a relatively low resistivity, wiring resistance can be reduced while preventing occurrence of cracks. In addition, tungsten is a high melting point material and has extremely high heat resistance to heat generated in the laser irradiation process, which allows laser irradiation conditions and materials of the sealing material 107 to be selected more freely. Moreover, tungsten is a material often used in semiconductor technology and for example, can be used as a conductive material of thin film transistors; therefore, in a display device including thin film transistors, the wiring 105 can be formed in the manufacturing process of the thin film transistors.

<Example of Structure Using Oxide Layer in Contact with Sealing Material>

An oxide layer in contact with the sealing material 107 is provided between the wiring 105 and the sealing material 107, thereby increasing the adhesion between the wiring 105 and the sealing material 107.

Figure 1C:
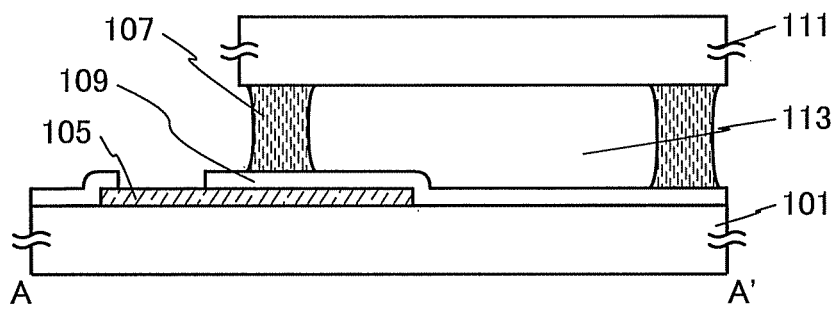

FIG. 1C illustrates an example in which an oxide layer 109 is provided between the wiring 105 and the sealing material 107. The oxide layer 109 is formed to cover the wiring 105, and the sealing material 107 is provided in contact with the oxide layer 109, so that the sealed region 113 is obtained. The oxide layer 109 includes an opening in a part of the outside of the sealed region 113, whereby a part of the top surface of the wiring 105 is exposed. A signal and the like for driving the light-emitting unit 103 can be input through the opening.

The oxide layer 109 is preferably made of an inorganic oxide material having a relatively high heat resistance, such as a metal oxide or a semiconductor oxide. For example, the oxide layer 109 can be made of an oxide of silicon, aluminum, tantalum, tungsten, yttrium, hafnium, gallium, or the like.

The oxide layer 109 may also be formed of an oxide of the conductive material used for the wiring 105. For example, the surface of the wiring 105 is oxidized by heat treatment or plasma treatment in an atmosphere containing an oxidizing gas, and the obtained oxide film may be used for the oxide layer 109. Alternatively, a natural oxide film formed on the surface of the wiring 105 may be used for the oxide layer 109. The oxide layer 109 may include a stack of a plurality of oxide films. For example, the oxide layer 109 may include a stack of an oxide film obtained by oxidizing the surface of the wiring 105, and another oxide film.

Although the oxide layer 109 is provided to cover the wiring 105 in FIG. 1C, the oxide layer 109 may be provided to overlap with at least the sealing material 107.

<Example of Structure Using Low-Resistance Wiring>

In order to prevent occurrence of cracks due to the stress applied to the sealing material 107, the aforementioned conductive material needs to be used for the wiring 105 at least in the area overlapping with the sealing material 107, and a lower-resistance wiring may be provided in the other area. An example of a structure using the wiring 105 and a low-resistance wiring 115 with a lower resistance than the wiring 105, for a given length, will be described below with reference to FIGS. 2A to 2D.

Figure 2A:
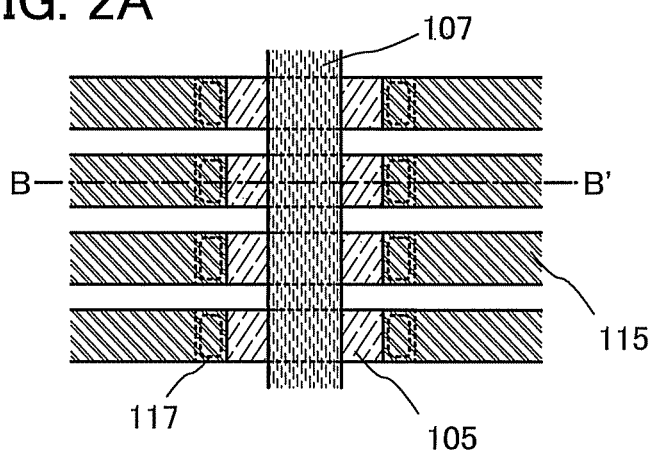
FIGS. 2A to 2D illustrate a light-emitting device of an embodiment of the present invention.
Figure 2B:
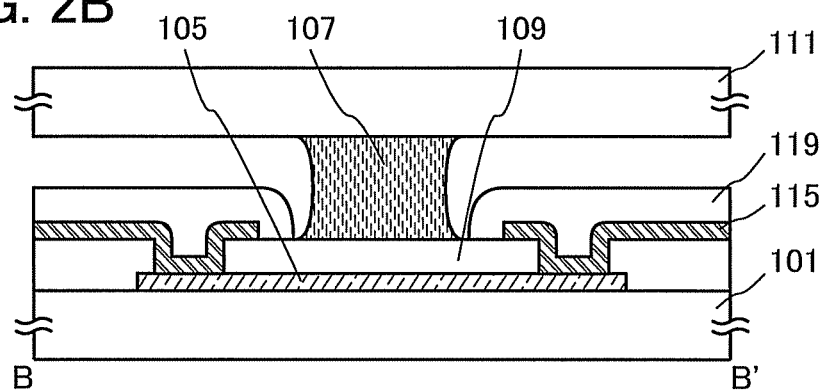

FIG. 2A is a schematic top view of the area where the wiring 105 overlaps with the sealing material 107, and its vicinity. FIG. 2B is a schematic cross-sectional view along line B-B' of FIG. 2A.

The wiring 105 is provided in the area overlapping with the sealing material 107 with the oxide layer 109 interposed therebetween. The both ends of the wiring 105 are electrically connected to the low-resistance wiring 115 at a connection portion 117. In the sealed region 113 (not illustrated), one end of the low-resistance wiring 115 is electrically connected to the wiring 105 at the connection portion 117, and the other end thereof is electrically connected to the light-emitting unit 103 (not illustrated). Outside the sealed region 113, the low-resistance wiring 115 is electrically connected to the wiring 105 and serves as a wiring for transmitting signals from the outside. As illustrated in FIG. 2B, an insulating layer 119 may be provided over the wiring 105.

As mentioned above, the wiring 105, which is made of a conductive material having a linear thermal expansion coefficient close to that of the material of the first substrate 101, is provided in the area overlapping with the sealing material 107, whereby occurrence of cracks can be prevented. On the other hand, the low-resistance wiring 115 is used in the other area, which prevents an increase in wiring resistance.

Figure 2C:
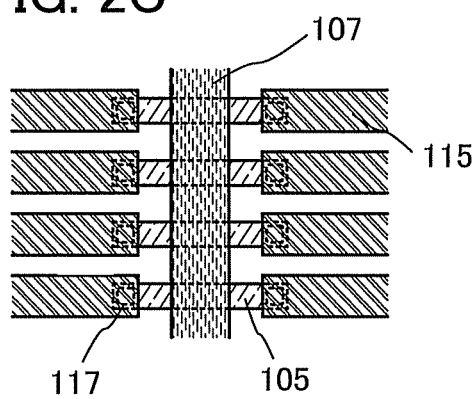

When the width of the wiring 105 is smaller than that of the low-resistance wiring 115 as illustrated in FIG. 2C, the distance between the low-resistance wirings 115 can be reduced. For example, in the case where an extremely high definition image display device is used as the light-emitting unit 103 or many kinds of signals are input, wiring density can be increased by using a low-resistance conductive material for the low-resistance wiring 115 and reducing the width of the wiring or the distance between the wirings as much as possible with such a structure.

Figure 2D:
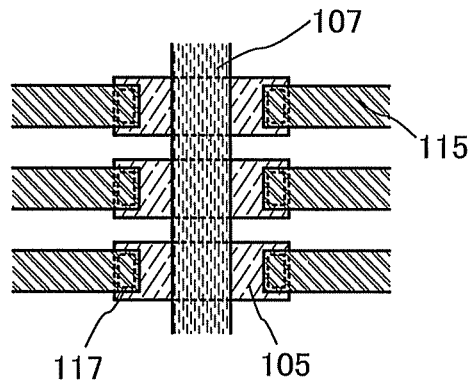

When the width of the wiring 105 is larger than that of the low-resistance wiring 115 as illustrated in FIG. 2D, an increase in the wiring resistance of the wiring 105 can be prevented. In addition, when the width of the wiring 105 is made larger than the distance between the wirings as much as possible, the intersection between the sealing material 107 and each wiring 105 can be irradiated with laser light under the same conditions.

<Example of Structure Using Buffer Layer>

In addition to the aforementioned wiring 105, a buffer layer made of the material of the wiring 105 is provided in the area where the sealing material 107 is formed. As a result, occurrence of cracks can be prevented and laser irradiation can be performed under the same conditions. Examples of the case of using such a buffer layer will be shown below with reference to FIGS. 3A to 3C.

Figure 3A:
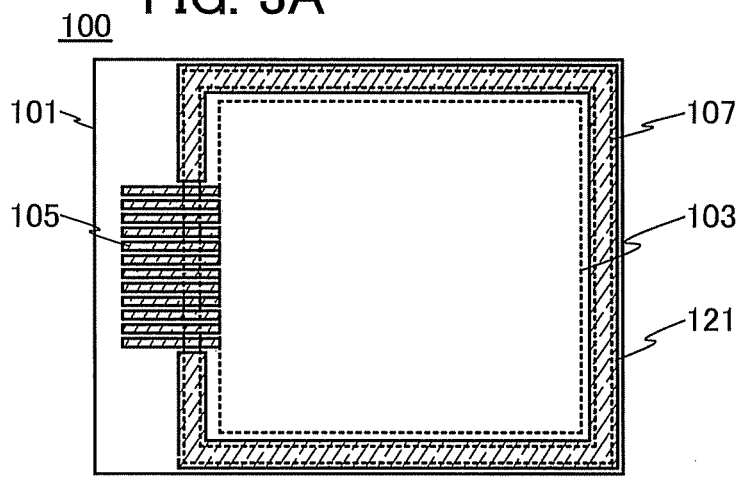
FIGS. 3A to 3C illustrate a light-emitting device of an embodiment of the present invention.
Figure 3B:
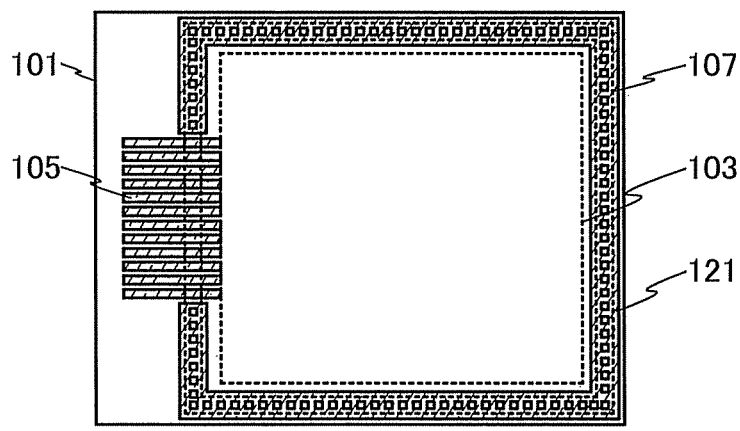
Figure 3C:
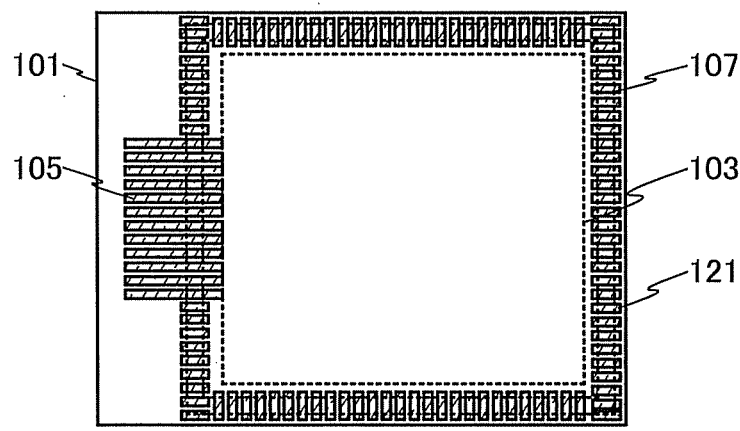

FIGS. 3A to 3C are schematic top views of the light-emitting device 100 including a buffer layer 121. Note that for clarity, only the first substrate 101, the wiring 105, and the buffer layer 121 are clearly illustrated in FIGS. 3A to 3C, and the areas in which the sealing material 107 and the light-emitting unit 103 are formed are denoted by dotted lines.

In FIG. 3A, the buffer layer 121 is provided to overlap with the sealing material 107, whereby the light-emitting unit 103 is surrounded by the buffer layer 121. When the buffer layer 121 is thus provided to overlap with the sealing material 107, occurrence of cracks can be prevented and laser irradiation can be performed under the same conditions as in the area where the wirings 105 are provided, resulting in simplification of the manufacturing process.

Note that the buffer layer 121 may be formed using the same layer as or a different layer from the wiring 105. In the case where the buffer layer 121 and the wiring 105 are formed using different layers, the buffer layer 121 is provided to overlap with the wiring 105 with an insulating layer interposed therebetween; furthermore, the buffer layer 121 may be provided to be a closed curve. Such a structure is preferable because the buffer layer 121 exists under the sealing material 107 and uniform heating can be realized even under the same laser irradiation conditions.

It is preferable that the oxide layer 109 in contact with the sealing material 107 be formed over the buffer layer 121 like in the case of the wiring 105, whereby the adhesion between the buffer layer 121 and the sealing material 107 is increased.

As illustrated in FIG. 3B, the buffer layer 121 may include a plurality of openings. Alternatively, a plurality of buffer layers 121 may be provided at intervals as illustrated in FIG. 3C. When the area where the buffer layer 121 does not exist is thus provided in the area overlapping with the sealing material 107, the area where the sealing material 107 overlaps with a conductive material can be made equal to the area where the plurality of wirings 105 are provided. Accordingly, in the laser irradiation, the amount of laser light reflected by the surface of the conductive material, thermal characteristics in the vicinity of an area irradiated with the laser light, and the like can be made uniform. As a result, variations in the shape of the sealing material 107 or the adhesion can be reduced. Note that in FIG. 3C, each of the plurality of buffer layers 121 may have an opening.

In the light-emitting device described in this embodiment, a material having a linear thermal expansion coefficient close to that of a substrate material is used for a wiring provided in the area overlapping with a sealing material formed by melting and solidifying glass frit. Accordingly, the stress applied to the sealing material can be reduced to the level almost equal to that in the area that does not overlap with the wiring, whereby occurrence of cracks due to the stress can be prevented. A light-emitting unit including an organic EL element can be used for such a light-emitting device. Thus, in such a light-emitting device, loss of hermeticity due to cracks can be prevented and the reliability of the light-emitting device can be significantly increased.

This embodiment can be combined with any of the other embodiments disclosed in this specification as appropriate.

Embodiment 2

In this embodiment, an example of a structure of a display device will be described with reference to FIGS. 4A and 4B and FIGS. 5A and 5B. In the display device, an image display device combining a thin film transistor and an organic EL element is used as the light-emitting unit shown in Embodiment 1.

FIG. 4A is a schematic top view of a display device 200 shown in this embodiment. In the display device 200, the first substrate 101 and the second substrate 111 are bonded to each other to be sealed with the sealing material 107, whereby the hermetically sealed region 113 shown FIG. 4B is formed. In the sealed region 113, a pixel portion 201 including a plurality of pixels and a driver circuit portion 203 driving the pixel portion 201 are formed over the first substrate 101. The display device 200 also includes the plurality of wirings 105 which are electrically connected to the driver circuit portion 203 and extend from the sealed region 113 to the outside of the sealed region 113. Outside the sealed region 113, an FPC 205 is provided to be electrically connected to the plurality of wirings 105. Through the FPC 205 and the plurality of wirings 105, a power supply potential, a common potential, and an electric signal such as a driving signal can be input from the outside to the driver circuit portion 203.

A structure including the pixel portion 201 and the driver circuit portion 203 in the sealed region 113 corresponds to the light-emitting unit.

FIG. 4B is a schematic cross-sectional view along line C-C' of FIG. 4A, which passes through an area including the FPC 205, the wiring 105, the driver circuit portion 203, and the pixel portion 201.

FIG. 4B illustrates an example in which the driver circuit portion 203 includes a CMOS circuit using a combination of an n-channel transistor 213 and a p-channel transistor 214. Note that the driver circuit portion 203 may include various kinds of circuits such as a CMOS circuit, a PMOS circuit, or an NMOS circuit. This embodiment shows a driver-integrated structure in which a driver circuit portion is formed over the same substrate as a pixel portion; however, the present invention is not limited to this structure, and a driver circuit portion may be provided separately from a substrate over which a pixel portion is formed.

FIG. 4B illustrates a cross-sectional structure of one pixel in the pixel portion 201. The pixel portion 201 includes a plurality of pixels each having a switching transistor 215, a current-controlling transistor 216, and a pixel electrode 223 electrically connected to an electrode (a source electrode or a drain electrode) of the transistor 216. An insulating layer 219 is formed to cover an end of the pixel electrode 223.

There is no particular limitation on the structure of the transistor included in the driver circuit portion 203 and the pixel portion 201. For example, a staggered transistor or an inverted-staggered transistor may be used, and either a top-gate transistor or a bottom-gate transistor may be used. A semiconductor material for the transistor is also not particularly limited; silicon or an oxide semiconductor containing at least one of indium, gallium, and zinc may be used. Furthermore, there is no particular limitation on the crystallinity of a semiconductor used for the transistor; an amorphous semiconductor or a crystalline semiconductor may be used.

The light-emitting element 221 includes the pixel electrode 223, an EL layer 225, and a common electrode 227. The structure, materials, and the like of the light-emitting element will be described in detail in the following embodiment.

As conductive materials for the pixel electrode 223 and the common electrode 227, a material that transmits light emitted from the EL layer 225 is used for an electrode through which light is transmitted, and a material that reflects light emitted from the EL layer 225 is used for an electrode provided on the side opposite to the electrode through which light is transmitted.

As the light-transmitting material that can be used for the electrode through which light is transmitted, indium oxide, indium tin oxide, indium zinc oxide, zinc oxide, zinc oxide to which gallium is added, graphene, and the like can be used. Other examples of the conductive material are a metal material such as gold, silver, platinum, magnesium, nickel, tungsten, chromium, molybdenum, iron, cobalt, copper, palladium, and titanium; an alloy material containing any of these metal materials; and nitride of any of these metal materials (e.g., titanium nitride). In the case of using the metal material (or the nitride of the metal material), the film thickness needs to be small enough to transmit light. A layered film of any of the above materials can also be used. For example, a layered film of a silver-magnesium alloy and indium tin oxide is preferably used because the conductivity can be increased.

As a light-reflecting material that can be used for the electrode provided on the side opposite to the electrode through which light is transmitted, the following can be used: a metal material such as aluminum, gold, platinum, silver, nickel, tungsten, chromium, molybdenum, iron, titanium, cobalt, copper, and palladium; or an alloy material containing any of these metal materials. Alternatively, lanthanum, neodymium, germanium, or the like may be added to the above metal material or the alloy material containing the metal material. Further, an alloy containing aluminum (aluminum alloy), such as an alloy of aluminum and titanium, an alloy of aluminum and nickel, and an alloy of aluminum and neodymium; or an alloy containing silver, such as an alloy of silver and copper and an alloy of silver and magnesium, may also be used. An alloy of silver and copper is preferable because of its high heat resistance. Furthermore, by stacking a metal film or a metal oxide film in contact with an aluminum alloy film, oxidation of the aluminum alloy film can be prevented. Examples of a material of the metal film or the metal oxide film are titanium and titanium oxide. It is also possible to use a layered film of any of the above light-transmitting materials and any of the above metal materials. For example, a layered film of silver and indium tin oxide, or a layered film of a silver-magnesium alloy and indium tin oxide can be employed.

The insulating layer 219 is provided to cover the end of the pixel electrode 223. The insulating layer 219 preferably has a curved surface with a curvature at its upper end or lower end, in order to be adequately covered with the common electrode 227 which is formed over the insulating layer 219. For example, it is preferable that the upper end or the lower end of the insulating layer 219 have a curved surface with a radius of curvature (0.2 µm to 3 µm). The insulating layer 219 can be formed using an organic compound such as a negative photosensitive resin or a positive photosensitive resin, or an inorganic compound such as silicon oxide or silicon oxynitride.

An insulating layer 229 is formed on a surface of the first substrate 101. The insulating layer 229 has an effect of preventing diffusion of impurities included in the first substrate 101. An insulating layer 231 is formed on and in contact with a second conductive layer serving as a source electrode or a drain electrode of each transistor. The insulating layer 231 has an effect of preventing diffusion of impurities into a semiconductor included in the transistors. The insulating layers 229 and 231 can be formed using an inorganic insulating film that prevents diffusion of impurities, for example, a semiconductor oxide film or a metal oxide film such as a silicon oxide film or an aluminum oxide film. Note that the insulating layers 229 and 231 are not necessarily provided.

An insulating layer 241 covering each transistor can be formed of an inorganic insulating material such as silicon oxide, silicon oxynitride, silicon nitride, or aluminum oxide, or an organic insulating material such as acrylic, polyimide, or siloxane.

On the second substrate 111, a color filter 233 is provided to overlap with the light-emitting element 221. The color filter 233 is provided in order to control the color of light emitted from the light-emitting element 221. For example, in a full-color display device using white light-emitting elements, a plurality of pixels provided with color filters of different colors are used. In that case, the color filters may have three colors of red (R), green (G), and blue (B) or four colors with yellow (Y) in addition to RGB.

A black matrix 235 is provided between the adjacent color filters 233. The black matrix 235 shields the pixel from light emitted from the light-emitting elements 221 of the adjacent pixels and prevents color mixing between the adjacent pixels. When the color filter 233 is provided so that its ends overlap with the black matrix 235, light leakage can be reduced. The black matrix 235 can be formed using a material that blocks light emitted from the light-emitting element 221, for example, a metal or an organic resin. Note that the black matrix 235 may be provided to overlap with a region other than the pixel portion 201, for example, the driver circuit portion 203.

An overcoat 237 may be formed to cover the color filter 233 and the black matrix 235. The overcoat 237 is made of a material that transmits light emitted from the light-emitting element 221, and for example, an inorganic insulating film or an organic insulating film can be used. Note that the overcoat 237 is not necessarily provided.

Although the schematic cross-sectional view of FIG. 4B illustrates only one light-emitting element 221, a plurality of light-emitting elements are arranged in matrix in the pixel portion 201. For example, light-emitting elements that emit light of three colors (R, and B) are selectively formed in the pixel portion 201, so that a display device capable of full color display can be obtained. Alternatively, a display device capable of full color display can be obtained by a combination of a color filter, and a light-emitting element including a white light-emitting EL layer, which is described in the following embodiment. Further, the light-emitting element may have any of a top emission structure, a bottom emission structure, and a dual emission structure. When a color filter is used in the bottom emission structure, it may be provided on the side through which light is emitted.

The first substrate 101 and the second substrate 111 are bonded to each other with the sealing material 107 along the edge of the second substrate 111, whereby the sealed region 113 is formed. Thus, the light-emitting element 221 is formed in the sealed region 113. The sealed region 113 may be filled with an inert gas such as a rare gas or a nitrogen gas, an organic resin, gel, or the like, or may be in a reduced pressure atmosphere. In the case where the sealed region 113 is filled with a gas, a solid, gel, or the like or brought into a reduced pressure atmosphere, impurities such as water or oxygen are preferably reduced in the sealed region 113 so that the reliability of the light-emitting element 221 is increased.

The wiring 105 electrically connected to the driver circuit portion 203 is led out from the sealed region 113, and electrically connected to the FPC 205 through a connector 239 in a part of the outside of the sealed region 113. Here, the wiring 105 is formed using the same layer as a first conductive layer serving as the gate electrode of each transistor. The wiring 105 is electrically connected to the driver circuit portion 203 through an opening formed in the insulating layer 241 covering each transistor.

In this structure, since the wiring 105 is formed using the same layer as the first conductive layer serving as the gate electrode of each transistor, it can be formed in the manufacturing process of the transistors, resulting in simplification of the process.

Between the wiring 105 and the sealing material 107, the insulating layer 231 is provided as an oxide layer in contact with the sealing material 107. In that case, the insulating layer 231 can be formed in a manner similar to that of the oxide layer 109 shown in Embodiment 1. Although the insulating layer 231 covering the source electrode and the drain electrode of each transistor is used as the oxide layer in this structure, another layer may be formed using a different material. When the oxide layer is provided in contact with the sealing material 107, increasing the adhesion between the wiring 105 and the sealing material 107 can be achieved.

In the case where a semiconductor oxide or a metal oxide is used for the insulating layer 241 covering each transistor, the insulating layer 241 can be used as the oxide layer in contact with the sealing material 107. Thus, an insulating layer made of an oxide, which is included in the transistor or the light-emitting element and provided over the conductive layer serving as the wiring 105, can be used as the oxide layer in contact with the sealing material 107. When the oxide layer and the insulating layer are formed at the same time, manufacturing process can be simplified.

The wiring 105 and the FPC 205 are electrically connected to each other through the connector 239. The connector 239 can be formed using a paste-form or sheet-form material that is obtained by mixing metal particles to a thermosetting resin and exhibits anisotropic conductivity by thermocompression bonding. As the metal particles, particles in which two or more kinds of metals are layered, for example, nickel particles coated with gold are preferably used.

The buffer layer 121 is provided in another part of the area overlapping with the sealing material 107. The buffer layer 121 can be formed using the same layer as the wiring 105. Over the buffer layer 121, like over the wiring 105, the insulating layer 231 is formed as the oxide film in contact with the sealing material 107. By thus providing the buffer layer 121 to overlap with the sealing material 107, the sealing material 107 can be formed under the same laser irradiation conditions, resulting in simplification of the process.

The wiring 105 needs to be provided at least in the area overlapping with the sealing material 107, and a low-resistance wiring is used in the other area, whereby wiring resistance can be reduced. An example of using a low-resistance wiring will be described below with reference to FIGS. 5A and 5B.

In the structure illustrated in FIG. 5A, the low-resistance wiring 115 is provided to be electrically connected to the FPC 205 through the connector 239. Outside the sealed region 113, the low-resistance wiring 115 is electrically connected to the wiring 105 through the opening in the insulating layer 241. Since the low-resistance wiring 115 is used in the area other than the area overlapping with the sealing material 107, wiring resistance can be reduced.

The low-resistance wiring 115 can be formed using the same layer as the source electrode or the drain electrode of each transistor, the same layer as the pixel electrode 223, or a stack of these layers. When the low-resistance wiring 115 is formed using the conductive layer included in the transistor or the light-emitting element, it can be formed in the manufacturing process of the transistor or the light-emitting element, which results in simplification of the process.

As illustrated in FIG. 5A, the low-resistance wiring 115 and the conductive layer serving as the wiring 105 are stacked in the area overlapping with the connector 239. Such a structure allows increasing of the wiring intensity in a connection portion with the FPC 205.

In the structure of FIG. 5B, outside the sealed region 113, the wiring 105 and the low-resistance wiring 115 are stacked to be used as a lead wiring. Such a stack of two or more wirings allows the wiring resistance to be further reduced.

In the display device described in this embodiment, a material having a linear thermal expansion coefficient close to that of a substrate material is used for a wiring provided in the area overlapping with a sealing material formed by melting and solidifying glass frit. Accordingly, the stress applied to the sealing material can be reduced to the level almost equal to that in the area that does not overlap with the wiring, whereby occurrence of cracks due to the stress can be prevented. Thus, in such a display device including an organic EL element, loss of hermeticity due to cracks can be prevented and the reliability of the display device can be significantly increased.

This embodiment can be combined with any of the other embodiments disclosed in this specification as appropriate.

Embodiment 3

In this embodiment, an example of a lighting device will be described with reference to FIGS. 6A and 6B. In the lighting device, a light source including an organic EL element is used as the light-emitting unit shown in Embodiment 1.

FIG. 6A is a schematic top view of a lighting device 300 shown in this embodiment. Note that for clarity, a top electrode 307 and an EL layer 305 are not represented in FIG. 6A, and the second substrate 111 is denoted by a dotted line.

The lighting device 300 includes the sealed region 113 surrounded by the first substrate 101, the second substrate 111, and the sealing material 107, and a light-emitting element 311 using an organic EL element is provided in the sealed region 113. A wiring 105b electrically connected to a bottom electrode 303 included in the organic EL element, and a wiring 105a electrically connected to the low-resistance wiring 115 electrically connected to the top electrode 307, are provided to extend from the sealed region 113. Connecting electrode 309a and connecting electrode 309b are provided outside the sealed region 113, and electrically connected to the wirings 105a and 105b, respectively. Thus, in the lighting device 300, the light-emitting element 311 can emit light when voltage is applied between the connecting electrode 309a and the connecting electrode 309b.

The light-emitting unit corresponds to the light-emitting element 311 including the bottom electrode 303 and the top electrode 307, and the low-resistance wiring 115, which are provided in the sealed region 113.

FIG. 6B is a schematic cross-sectional view along line D-D' of FIG. 6A, which passes through an area including the connecting electrode 309a, the wiring 105a, the low-resistance wiring 115, and the bottom electrode 303.

The light-emitting element 311 is formed over an insulating layer 313, an includes the bottom electrode 303, an EL layer 305, and the top electrode 307. The structure, materials, and the like of the light-emitting element will be described in detail in the following embodiment.

The low-resistance wiring 115 is provided over the insulating layer 313, so that the light-emitting element 311 is surrounded by the low-resistance wiring 115.

The ends of the low-resistance wiring 115 and the bottom electrode 303 are covered with the insulating layer 315. The insulating layer 315 can be formed in a manner similar to that of the insulating layer 219 shown in Embodiment 2.

The top electrode 307 is electrically connected to the low-resistance wiring 115 through an opening formed in the insulating layer 315. In this manner, a plurality of light-emitting elements 311 are provided and the low-resistance wiring 115 is provided between the light-emitting elements to be electrically connected to the top electrode 307. Accordingly, it is possible to prevent potential drop due to the resistance of the top electrode 307 and reduce variations in luminance.

In FIG. 6B, the bottom electrode 303 and the low-resistance wiring 115 are denoted by different hatching patterns for clarity. In the case where the bottom electrode 303 has a sufficiently low resistance, the bottom electrode 303 and the low-resistance wiring 115 can be formed at the same time using the same film. In this embodiment, the low-resistance wiring 115 and the bottom electrode 303 are provided in parallel so as not to overlap with each other; however, the present invention is not limited to this structure, and they only need to be insulated from each other. For example, the low-resistance wiring 115 may be provided over the bottom electrode 303 with an insulating layer interposed therebetween.

A part of the low-resistance wiring 115 is electrically connected to the wiring 105a through an opening formed in the insulating layer 313. The wiring 105a extends from the sealed region 113 to be electrically connected to the connecting electrode 309a.

The wiring 105a and the wiring 105b need to be provided at least in the area overlapping with the sealing material 107. In this embodiment, the wiring 105a and the wiring 105b are led outside the sealed region 113; alternatively, the low-resistance wiring 115 may be led from the sealed region 113 as shown in the above embodiment.

When an oxide layer in contact with the sealing material 107 is provided over the wiring 105a and the wiring 105b, the adhesion between the sealing material 107 and the wirings 105a and 105b can be increased.

The buffer layer 121 shown in the above embodiment may be provided in the area overlapping with the sealing material 107.

In the lighting device described in this embodiment, a material having a linear thermal expansion coefficient close to that of a substrate material is used for a wiring provided in the area overlapping with a sealing material formed by melting and solidifying glass frit. Accordingly, the stress applied to the sealing material can be reduced to the level almost equal to that in the area that does not overlap with the wiring, whereby occurrence of cracks due to the stress can be prevented. Thus, in such a lighting device including an organic EL element, loss of hermeticity due to cracks can be prevented and the reliability of the lighting device can be significantly increased.

This embodiment can be combined with any of the other embodiments disclosed in this specification as appropriate.

Embodiment 4

In this embodiment, an example of the EL layer that can be applied to an embodiment of the present invention will be described with reference to FIGS. 7A to 7C.

Figure 7A:
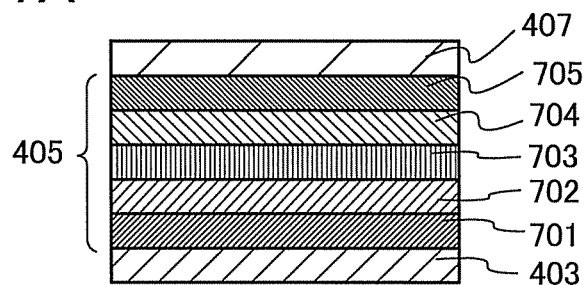
FIGS. 7A to 7C illustrate an EL layer of an embodiment of the present invention, which can be applied to a light-emitting device.

An EL layer 405 illustrated in FIG. 7A is provided between a first electrode 403 and a second electrode 407. The first electrode 403 and the second electrode 407 can be formed in a manner similar to that of the pixel electrode or the common electrode shown in Embodiment 2, or the bottom electrode or the top electrode shown in Embodiment 3.

A light-emitting element including the EL layer 405, which is described in this embodiment, can be applied to the light-emitting device shown in the above embodiments.

The EL layer 405 needs to include at least a light-emitting layer containing a light-emitting organic compound. The EL layer 405 may have a layered structure of a layer containing a substance with a high electron-transport property, a layer containing a substance with a high hole-transport property, a layer containing a substance with a high electron-injection property, a layer containing a substance with a high hole-injection property, a layer containing a bipolar substance (a substance with a high electron-transport property and a high hole-transport property), and the like in appropriate combination. In the EL layer 405 of this embodiment, a hole-injection layer 701, a hole-transport layer 702, a layer 703 containing a light-emitting organic compound, an electron-transport layer 704, and an electron-injection layer 705 are stacked in this order over the first electrode 403. Note that the stacking order of these layers may be reversed.

Description will be made on a method for manufacturing the EL layer 405 included in the light-emitting element illustrated in FIG. 7A.

The hole-injection layer 701 is a layer containing a substance with a high hole-injection property. As the substance with a high hole-injection property, for example, the following metal oxides can be used: molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide. A phthalocyanine-based compound such as phthalocyanine (abbreviation: $H_2Pc$), or copper(II) phthalocyanine (abbreviation: CuPc) can also be used.

Alternatively, aromatic amine compounds which are low molecular organic compounds, and the like can be used.

Further alternatively, high molecular compounds (e.g., oligomers, dendrimers, or polymers) can be used. A high molecular compound to which acid is added can also be used.

In particular, the hole-injection layer 701 is preferably made of a composite material in which an acceptor substance is mixed with an organic compound with a high hole-transport property. The use of the composite material in which an acceptor substance is mixed with a substance with a high hole-transport property, allows efficient hole injection from the first electrode 403, and reduction in driving voltage of the light-emitting element. Such a composite material can be formed by co-evaporation of a substance with a high hole-transport property and an acceptor substance (an electron acceptor). By using the composite material for the hole-injection layer 701, holes can be easily injected from the first electrode 403 to the EL layer 405.

As the organic compound used for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound with a high hole-transport property. Specifically, a substance having a hole mobility of $10^{-6}$ cm$^2$/Vs or higher is preferably used. Note that other substances may also be used as long as their hole-transport property is higher than their electron-transport property.

As the organic compound used for the composite material, an aromatic amine compound, a carbazole derivative, an aromatic hydrocarbon compound with a high hole mobility can be used.

Examples of the acceptor substance include an organic compound and a transition metal oxide. Oxides of metals belonging to Groups 4 to 8 in the periodic table can also be used. Specifically, it is preferable to use vanadium oxide, niobium oxide, tantalum oxide, chromium oxide, molybdenum oxide, tungsten oxide, manganese oxide, or rhenium oxide because of their high electron-accepting property. Among these, molybdenum oxide is especially preferable since it is stable in the air and has a low hygroscopic property to be easily treated.

A composite material may be formed of a high molecular compound and the aforementioned electron acceptor and used for the hole-injection layer 701.

The hole-transport layer 702 is a layer which contains a substance with a high hole-transport property. As the substance with a high hole-transport property, for example, it is possible to use an aromatic amine compound, which is a substance having a hole mobility of $10^{-6}$ cm$^2$/Vs or higher. Other substances may also be used as long as their hole-transport property is higher than their electron-transport property. Note that the hole-transport layer 702 is not limited to a single layer, and two or more layers containing the aforementioned substances may be stacked.

A carbazole derivative, an anthracene derivative, or a high molecular compound with a high hole-transport property may also be used for the hole-transport layer 702.

For the layer 703 containing a light-emitting organic compound, a fluorescent compound which exhibits fluorescence or a phosphorescent compound which exhibits phosphorescence can be used.

Note that the layer 703 containing a light-emitting organic compound may have a structure in which a light-emitting organic compound (guest material) is dispersed in another substance (host material). Various kinds of materials can be used as the host material, and it is preferable to use a substance which has a lowest unoccupied molecular orbital level (LUMO level) higher than that of the light-emitting substance and has a highest occupied molecular orbital level (HOMO level) lower than that of the light-emitting substance.

Alternatively, plural kinds of materials can be used as the host material. For example, a substance preventing crystallization may be added in order to prevent crystallization. A different kind of substance may be further added in order to efficiently transfer energy to the guest material.

The structure in which a guest material is dispersed in a host material, prevents crystallization of the layer 703 containing a light-emitting organic compound. Further, concentration quenching due to high concentration of the guest material can also be prevented.

For the layer 703 containing a light-emitting organic compound, a high molecular compound can also be used.

When a plurality of layers each containing a light-emitting organic compound are provided and the emission colors of the layers are made different, light emission of a desired color can be obtained from the light-emitting element as a whole. For example, in a light-emitting element including two layers each containing a light-emitting organic compound, the emission color of a first layer containing a light-emitting organic compound and the emission color of a second layer containing a light-emitting organic compound are made complementary, so that the light-emitting element as a whole can emit white light. Note that "complementary colors" refer to colors that can produce an achromatic color when mixed. That is, a mixture of light emitted from substances that emit light of complementary colors produces white light. This can be applied to a light-emitting element including three or more layers each containing a light-emitting organic compound.

The electron-transport layer 704 is a layer containing a substance with a high electron-transport property. The substance with a high electron-transport property is mainly one that has an electron mobility of $10^{-6}$ cm$^2$/Vs or higher. The electron-transport layer 704 is not limited to a single layer and may be a stack of two or more layers made of such a substance.

The electron-injection layer 705 is a layer containing a substance with a high electron-injection property. For the electron-injection layer 705, an alkali metal, an alkaline earth metal, or a compound thereof (e.g., lithium, cesium, calcium, lithium fluoride, cesium fluoride, calcium fluoride, or lithium oxide) can be used. A rare earth metal compound such as erbium fluoride can also be used. It is also possible to use the aforementioned substance for forming the electron-transport layer 704.

Note that the hole-injection layer 701, the hole-transport layer 702, the layer 703 containing a light-emitting organic compound, the electron-transport layer 704, and the electron-injection layer 705, which are described above, can each be formed by an evaporation method (e.g., a vacuum evaporation method), an ink-jet method, a coating method, or the like.

Figure 7B:
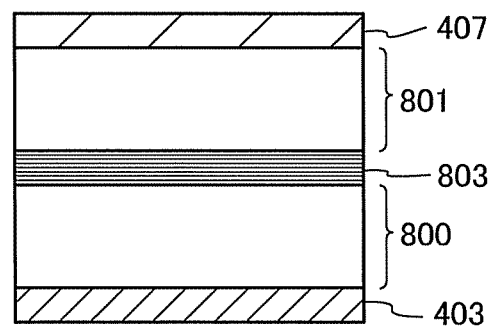

As illustrated in FIG. 7B, a plurality of EL layers may be stacked between the first electrode 403 and the second electrode 407. In that case, a charge generation layer 803 is preferably provided between a first EL layer 800 and a second EL layer 801 which are stacked. The charge generation layer 803 can be formed by using the above-mentioned composite material. Alternatively, the charge generation layer 803 may have a layered structure of a layer containing the composite material and a layer containing another material. In that case, as the layer including another material, a layer including a substance with an electron-donating property (donor substance) and a substance with a high electron-transport property, a layer formed using a transparent conductive film, or the like can be used. A light-emitting element having such a structure is unlikely to suffer the problem of energy transfer, quenching, or the like and gives wider choice of materials, thereby easily having both high light emission efficiency and a long lifetime. Moreover, it is easy to obtain phosphorescence from one EL layer and fluorescence from the other EL layer. This structure can be combined with the above-mentioned structure of the EL layer.

When the emission colors of EL layers are made different, a light-emitting element as a whole can provide light emission of a desired color. For example, when a light-emitting element including two EL layers is formed so that the emission color of the first EL layer and the emission color of the second EL layer are complementary colors, the light-emitting element as a whole can emit white light. Note that "complementary colors" refer to colors that can produce an achromatic color when mixed. That is, a mixture of light emitted from substances that emit light of complementary colors produces white light. This can be applied to a light-emitting element including three or more EL layers.

In order to obtain white light with high color rendering properties, the emission spectrum needs to cover the whole visible light range and thus a light-emitting element preferably includes three or more EL layers stacked. For example, such a light-emitting element can be formed by stacking EL layers emitting light of the respective colors of red, blue, and green. In this manner, the color rendering properties of a light-emitting element can be improved by stacking EL layers of different three or more colors.

An optical adjustment layer may be formed between the first electrode 403 and the second electrode 407. The optical adjustment layer adjusts the optical distance between a reflective electrode and a light-transmitting electrode. With the optical adjustment layer, light with wavelengths in a specific range can be enhanced so that the color tone can be adjusted.

Figure 7C:
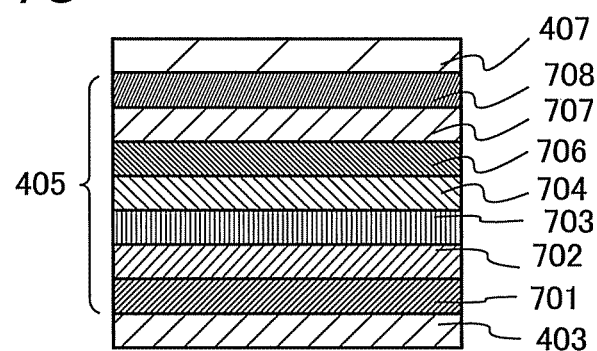

As illustrated in FIG. 7C, the EL layer 405 may include, between the first electrode 403 and the second electrode 407, the hole-injection layer 701, the hole-transport layer 702, the layer 703 containing a light-emitting organic compound, the electron-transport layer 704, an electron-injection buffer layer 706, an electron-relay layer 707, and a composite material layer 708 that is in contact with the second electrode 407.

The composite material layer 708 which is in contact with the second electrode 407 is preferably provided, because it allows reducing damage caused to the EL layer 405 particularly when the second electrode 407 is formed by sputtering. The composite material layer 708 can be formed using the above-described composite material in which an acceptor substance is mixed with an organic compound with a high hole-transport property.

Further, by providing the electron-injection buffer layer 706, an injection barrier between the composite material layer 708 and the electron-transport layer 704 can be reduced; thus, electrons generated in the composite material layer 708 can be easily injected to the electron-transport layer 704.

The electron-injection buffer layer 706 can be made of a substance with a high electron-injection property, for example, an alkali metal, an alkaline earth metal, a rare earth metal, or a compound of such a metal (e.g., an alkali metal compound (including oxide such as lithium oxide, halide, or carbonate such as lithium carbonate or cesium carbonate), an alkaline earth metal compound (including oxide, halide, or carbonate), or a rare earth metal compound (including oxide, halide, or carbonate)).

When the electron-injection buffer layer 706 contains a substance with a high electron-transport property and a donor substance, the donor substance is preferably added so that the mass ratio of the donor substance to the substance with a high electron-transport property is 0.001:1 to 0.1:1. As the donor substance, any of the following can be used, for example: an organic compound such as tetrathianaphthacene (abbreviation: TTN), nickelocene, and decamethylnickelocene, as well as an alkali metal, an alkaline earth metal, a rare earth metal, and a compound of such a metal (e.g., an alkali metal compound (including oxide such as lithium oxide, halide, and carbonate such as lithium carbonate and cesium carbonate), an alkaline earth metal compound (including oxide, halide, and carbonate), and a rare earth metal compound (including oxide, halide, and carbonate)). Note that as the substance with a high electron-transport property, the material for the electron-transport layer 704 described above can be used.

Furthermore, the electron-relay layer 707 is preferably formed between the electron-injection buffer layer 706 and the composite material layer 708. The electron-relay layer 707 is not necessarily provided; by providing the electron-relay layer 707 with a high electron-transport property, electrons can be rapidly transported to the electron-injection buffer layer 706.

In the structure in which the electron-relay layer 707 is sandwiched between the composite material layer 708 and the electron-injection buffer layer 706, the acceptor substance contained in the composite material layer 708 and the donor substance contained in the electron-injection buffer layer 706 are less likely to interact with each other, and thus their functions hardly interfere with each other. Accordingly, an increase in drive voltage can be prevented.

The electron-relay layer 707 contains a substance with a high electron-transport property and is formed so that the LUMO level of the substance with a high electron-transport property is located between the LUMO level of the acceptor substance contained in the composite material layer 708 and the LUMO level of the substance with a high electron-transport property contained in the electron-transport layer 704. In the case where the electron-relay layer 707 contains a donor substance, the donor level of the donor substance is controlled to be located between the LUMO level of the acceptor substance in the composite material layer 708 and the LUMO level of the substance with a high electron-transport property contained in the electron-transport layer 704. As a specific value of the energy level, the LUMO level of the substance with a high electron-transport property contained in the electron-relay layer 707 is preferably −5.0 eV or more, more preferably −5.0 eV to −3.0 eV.

As the substance with a high electron-transport property contained in the electron-relay layer 707, a phthalocyanine-based material or a metal complex having a metal-oxygen bond and an aromatic ligand is preferably used.

As the metal complex having a metal-oxygen bond and an aromatic ligand, which is contained in the electron-relay layer 707, a metal complex having a metal-oxygen double bond is preferably used. Since the metal-oxygen double bond has an acceptor property (a property of easily accepting electrons), electrons can be transferred (donated and accepted) more easily. Further, the metal complex having a metal-oxygen double bond is considered stable. Thus, the use of the metal complex having the metal-oxygen double bond makes it possible to drive the light-emitting element more stably at low voltage.

As a metal complex having a metal-oxygen bond and an aromatic, ligand, a phthalocyanine-based material is preferable. In particular, it is preferable to use a material in which a metal-oxygen double bond is likely to act on another molecule in terms of a molecular structure and which has a high acceptor property.

Note that as the phthalocyanine-based material described above, a phthalocyanine-based material having a phenoxy group is preferably used. Specifically, a phthalocyanine derivative having a phenoxy group, such as PhO—VOPc, is preferable. The phthalocyanine derivative having, a phenoxy group is soluble in a solvent. For that reason, such a phthalocyanine derivative has an advantage of being easily handled during formation of a light-emitting element. Owing to the solubility in a solvent, such a phthalocyanine derivative also has an advantage of facilitating maintenance of an apparatus used for film formation.

The electron-relay layer 707 may further contain a donor substance. As the donor substance, any of the following can be used, for example: an organic compound such as tetrathianaphthacene (abbreviation: TTN), nickelocene, or decamethylnickelocene, as well as an alkali metal, an alkaline earth metal, a rare earth metal, and a compound of such a metal (e.g., an alkali metal compound (including oxide such as lithium oxide, halide, and carbonate such as lithium carbonate or cesium carbonate), an alkaline earth metal compound (including oxide, halide, and carbonate), and a rare earth metal compound (including oxide, halide, and carbonate)). When such a donor substance is contained in the electron-relay layer 707, electrons can be easily transferred and the light-emitting element can be driven at lower voltage.

In the case where a donor substance is contained in the electron-relay layer 707, other than the materials described above as examples of the substance with a high electron-transport property, a substance having a LUMO level higher than the acceptor level of the acceptor substance contained in the composite material layer 708 can be used. Specifically, the LUMO level of the substance is preferably −5.0 eV or more, more preferably −5.0 eV to −3.0 eV. Examples of such a substance are a perylene derivative and a nitrogen-containing condensed aromatic compound. Note that a nitrogen-containing condensed aromatic compound is preferably used for the electron-relay layer 707 because of its stability.

Note that in the case where a donor substance is contained in the electron-relay layer 707, the electron-relay layer 707 may be formed by a method such as co-evaporation of the substance with a high electron-transport property and the donor substance.

The hole-injection layer 701, the hole-transport layer 702, the layer 703 containing a light-emitting organic compound, and the electron-transport layer 704 may each be formed using any of the above materials.

In such a manner, the EL layer 405 in this embodiment can be formed.

This embodiment can be combined with any of the other embodiments disclosed in this specification as appropriate.

Embodiment 5

In this embodiment, examples of an electronic device or a lighting device using the light-emitting device of an embodiment of the present invention will be described with reference to FIGS. 8A to 8E.

Examples of the electronic devices using the light-emitting device are television sets (also referred to as televisions or television receivers), monitors of computers or the like, cameras such as digital cameras and digital video cameras, digital photo frames, mobile phones (also referred to as cell phones or cellular phones), portable game consoles, personal digital assistants, audio reproducing devices, and large-sized game machines such as pachinko machines. Specific examples of these electronic devices are illustrated in FIGS. 8A to 8E.

Figure 8A:
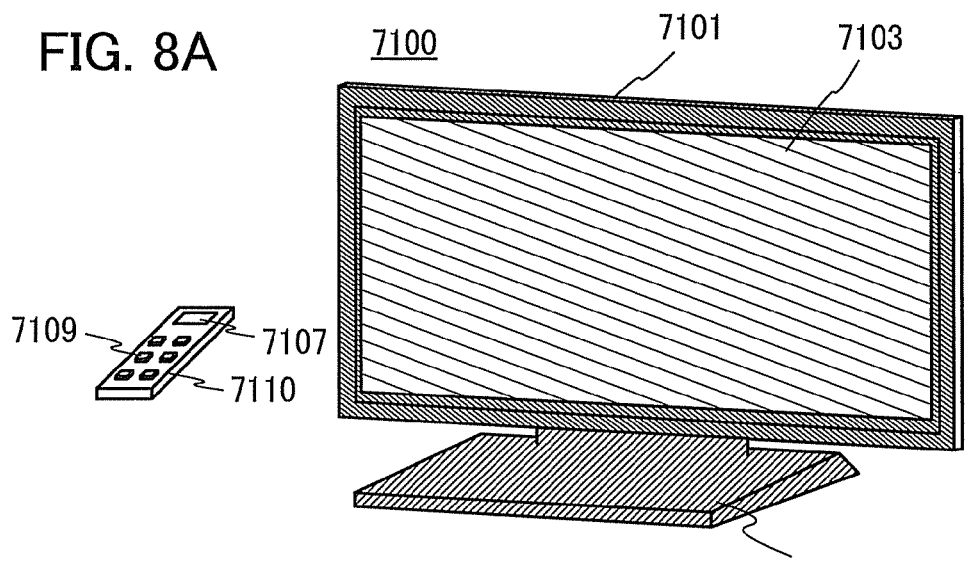
FIGS. 8A to 8E illustrate electronic devices and a lighting device of an embodiment of the present invention, which include a light-emitting device.

FIG. 8A illustrates an example of a television set. In a television set 7100, a display portion 7103 is incorporated in a housing 7101. Images can be displayed on the display portion 7103, and the light-emitting device can be used for the display portion 7103. Here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. The remote controller 7110 may have a display portion 7107 for displaying data output from the remote controller 7110.

Note that the television set 7100 is provided with a receiver, a modem, and the like. A general television broadcast can be received with the receiver. When the television set 7100 is connected to a communication network with or without wires via the modem, one-way (from a sender to a receiver) or two-way (between a sender and a receiver or between receivers) information communication can be performed.

Figure 8B:
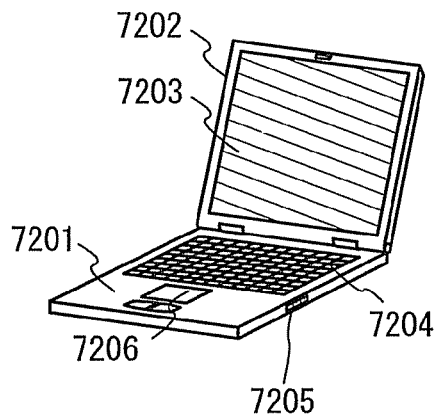

FIG. 8B illustrates a computer that includes a main body 7201, a housing 7202, a display portion 7203, a keyboard 7204, an external connection port 7205, a pointing device 7206, and the like. This computer is manufactured using the light-emitting device for the display portion 7203.

Figure 8C:
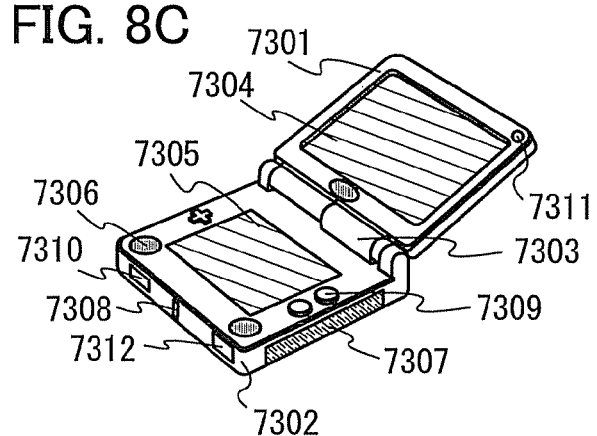

FIG. 8C illustrates a portable game console that includes two housings, a housing 7301 and a housing 7302, which are connected with a joint portion 7303 so that the portable game console can be opened or folded. A display portion 7304 is incorporated in the housing 7301, and a display portion 7305 is incorporated in the housing 7302. The portable game console in FIG. 8C also includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, tilt angle, vibration, smell, or infrared rays), and a microphone 7312), and the like. Needless to say, without limitation to the above structure, the portable game console can include other accessories as appropriate as long as the light-emitting device is used for at least one of the display portions 7304 and 7305. The portable game console in FIG. 8C has a function of reading a program or data stored in a recording medium to display it on the display portion, and a function of sharing information with another portable game console by wireless communication. The portable game console in FIG. 8C can have a variety of functions without limitation to the above functions.

Figure 8D:
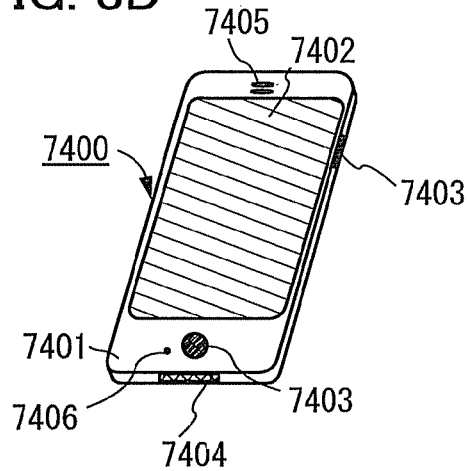

FIG. 8D illustrates an example of a mobile phone. A mobile phone 7400 includes a display portion 7402 incorporated in a housing 7401, an operation button 7403, an external connection port 7404, a speaker 7405, a microphone 7406, and the like. The mobile phone 7400 is manufactured using the light-emitting device for the display portion 7402.

When the display portion 7402 is touched with a finger or the like, data can be input into the mobile phone 7400 in FIG. 8D. Operations such as making a call and creating an e-mail can be performed by touch on the display portion 7402 with a finger or the like.

There are mainly three screen modes of the display portion 7402. The first is a display mode mainly for displaying images. The second is an input mode mainly for inputting data such as text. The third is a display-and-input mode in which two modes of the display mode and the input mode are combined.

For example, in the case of making a call or creating an e-mail, a text-input mode mainly for inputting text is selected for the display portion 7402 so that text displayed on the screen can be input. In that case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation button 7403 of the housing 7401. The screen modes can also be switched depending on kinds of images displayed on the display portion 7402. For example, when a signal of an image displayed on the display portion is a signal of moving image data, the screen mode is switched to the display mode. In the case of a signal of text data, the screen mode is switched to the input mode.

In the input mode, when input by touching the display portion 7402 is not performed within a specified period while a signal is detected by an optical sensor in the display portion 7402, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. When a backlight or sensing light source that emits near-infrared light is provided in the display portion, an image of a finger vein, a palm vein, or the like can be taken.

Figure 8E:
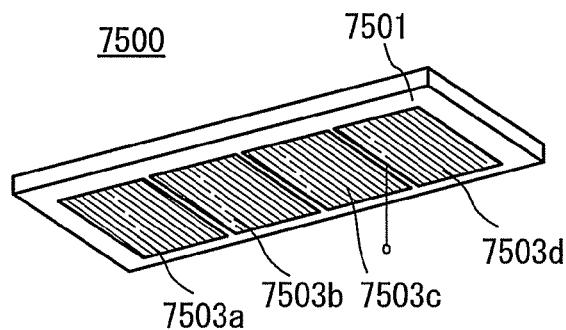

FIG. 8E illustrates an example of a lighting device. In a lighting device 7500, light-emitting devices 7503a to 7503d of an embodiment of the present invention are incorporated in a housing 7501 as light sources. The lighting device 7500 can be attached to a ceiling, a wall, or the like.

The light-emitting devices 7503a to 7503d each emit light having high brightness and a pale color, causing less eyestrain even in long-term use, light of a bright red color, and light of a bright color different from the red color. By adjusting conditions under which light-emitting elements are driven for each emission color, a lighting device whose hue can be adjusted by a user can be achieved.

Figure 9A:
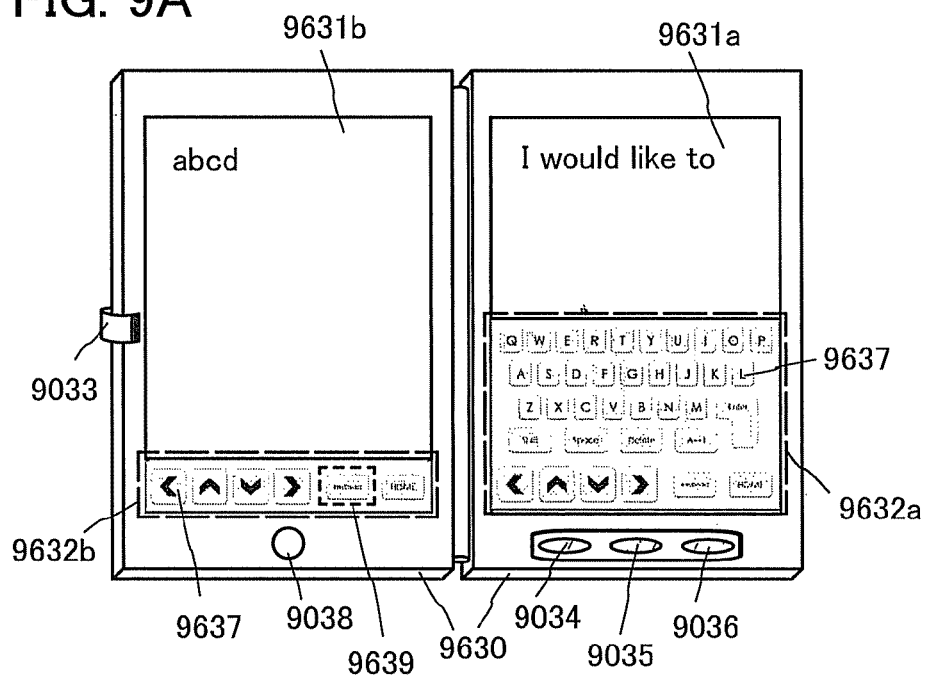
FIGS. 9A to 9C illustrate an electronic device of an embodiment of the present invention, which includes a light-emitting device.
Figure 9B:
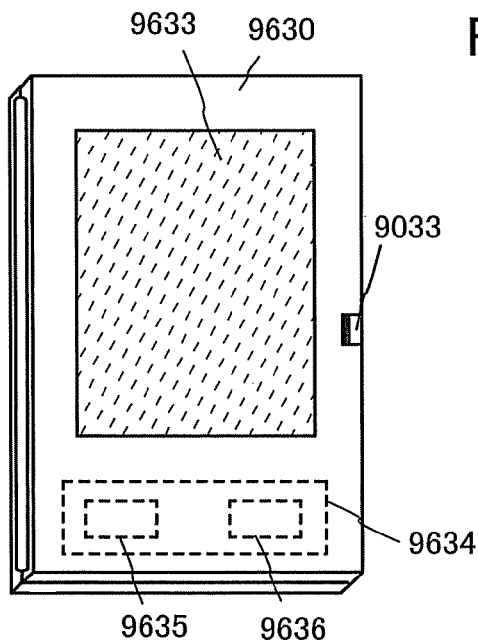

FIGS. 9A and 9B illustrate a tablet terminal that can be folded. In FIG. 9A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038. The tablet terminal is manufactured using the light-emitting device for one or both of the display portion 9631a and the display portion 9631b.

A touch panel area 9632a can be provided in a part of the display portion 9631a, in which area, data can be input by touching displayed operation keys 9637. Note that half of the display portion 9631a has only a display function and the other half has a touch panel function. However, an embodiment of the present invention is not limited to this structure, and the whole display portion 9631a may have a touch panel function. For example, a keyboard can be displayed on the whole display portion 9631a to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, other detecting devices such as sensors for detecting inclination, like a gyroscope or an acceleration sensor, may be incorporated in the tablet terminal.

Although the display portion 9631a and the display portion 9631b have the same display area in FIG. 9A, an embodiment of the present invention is not limited to this example. The display portion 9631a and the display portion 9631b may have different areas or different display quality. For example, higher definition images may be displayed on one of the display portions 9631a and 9631b.

FIG. 9B illustrates the tablet terminal folded, which includes the housing 9630, a solar battery 9633, a charge and discharge control circuit 9634, a battery 9635, and a DCDC converter 9636. Note that FIG. 9B shows an example in which the charge and discharge control circuit 9634 includes the battery 9635 and the DCDC converter 9636.

Since the tablet terminal can be folded, the housing 9630 can be closed when not in use. Thus, the display portions 9631a and 9631b can be protected, which makes it possible to provide a tablet terminal with high durability and improved reliability for long-term use.

The tablet terminal illustrated in FIGS. 9A and 9B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar battery 9633, which is attached on the surface of the tablet terminal, supplies electric power to a touch panel, a display portion, an image signal processor, and the like. Note that a structure in which the solar battery 9633 is provided on one or both surfaces of the housing 9630 is preferable because the battery 9635 can be charged efficiently. The use of a lithium ion battery as the battery 9635 is advantageous in downsizing or the like.

Figure 9C:
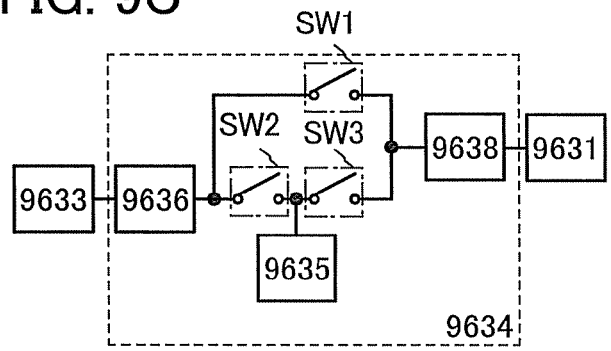

The structure and operation of the charge and discharge control circuit 9634 illustrated in FIG. 9B are described with reference to a block diagram of FIG. 9C. FIG. 9C illustrates the solar battery 9633, the battery 9635, the DCDC converter 9636, a converter 9638, switches SW1 to SW3, and the display portion 9631. The battery 9635, the DCDC converter 9636, the converter 9638, and the switches SW1 to SW3 correspond to the charge and discharge control circuit 9634 in FIG. 9B.

First, description is made on an example of the operation in the case where power is generated by the solar battery 9633 using external light. The voltage of power generated by the solar battery 9633 is raised or lowered by the DCDC converter 9636 so that a voltage for charging the battery 9635 is obtained. When the display portion 9631 is operated with the power from the solar battery 9633, the switch SW1 is turned on and the voltage of the power is raised or lowered by the converter 9638 to a voltage needed for operating the display portion 9631. When display is not performed on the display portion 9631, the switch SW1 is turned off and the switch SW2 is turned on so that the battery 9635 can be charged.

Although the solar battery 9633 is shown as an example of a charge means, there is no particular limitation on the charge means and the battery 9635 may be charged with another means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

It is needless to say that an embodiment of the present invention is not limited to the electronic device illustrated in FIGS. 9A to 9C as long as the display area described in the above embodiment is included.

In the aforementioned light-emitting devices such as the electronic devices and the lighting devices, a material having a linear thermal expansion coefficient close to that of a substrate material is used for a wiring provided in the area overlapping with a sealing material formed by melting and solidifying glass frit. Accordingly, the stress applied to the sealing material can be reduced to the level almost equal to that in the area that does not overlap with the wiring, whereby occurrence of cracks due to the stress can be prevented. Thus, in such light-emitting devices including an organic EL element, loss of hermeticity due to cracks can be prevented and the reliability of the light-emitting devices such as the electronic devices and the lighting devices can be significantly increased.

This embodiment can be combined with any of the other embodiments disclosed in this specification as appropriate.

This application is based on Japanese Patent Application serial No. 2011-182642 filed with Japan Patent Office on Aug. 24, 2011, the entire contents of which are hereby incorporated by reference.

What is claimed is:

1. An electronic apparatus comprising:
a first substrate;
a wiring on the first substrate, the wiring being formed from an electrically conductive material and comprising tungsten;
a low-resistance wiring on the first substrate;
a second substrate; and
a glass frit material interposed between the first substrate and the second substrate, and between the wiring and the second substrate, so that a first portion of the wiring is located inside of a sealed region defined by the first substrate, the second substrate, and the glass frit material, and a second portion of the wiring is located outside of the sealed region,
wherein a difference in linear thermal expansion coefficient between the electrically conductive material of the wiring and a material of the first substrate is 5 ppm/K or less over a temperature range of 0° C. to 500° C.,
wherein the low-resistance wiring comprises a first low-resistance wiring portion formed inside of the sealed region and a second low-resistance wiring portion formed outside of the sealed region,
wherein the first portion of the wiring is electrically connected to the first low-resistance wiring portion at a first connecting portion formed inside of the sealed region, wherein the second portion of the wiring is electrically connected to the second low-resistance wiring portion at a second connecting portion formed outside of the sealed region, and
wherein, for a given length, the first low-resistance wiring portion and the second low-resistance wiring portion both have an electrical resistance lower than the wiring.

2. The electronic apparatus according to claim 1, wherein the difference in linear thermal expansion coefficient between the electrically conductive material of the wiring and the material of the first substrate is 2 ppm/K or less over the temperature range of 0° C. to 500° C.

3. The electronic apparatus according to claim 1, wherein the wiring is made of tungsten.

4. The electronic apparatus according to claim 1, further comprising:
a semiconductor oxide layer interposed between the wiring and the glass frit material.

5. The electronic apparatus according to claim 1, further comprising:
a low-resistance wiring formed either inside or outside of the sealed region, and electrically connected to the wiring,
wherein, for a given length, the low-resistance wiring has an electrical resistance lower than the wiring.

6. A light-emitting device comprising:
a first substrate;
a wiring on the first substrate, the wiring being formed from an electrically conductive material and comprising tungsten;
a low-resistance wiring on the first substrate;
a second substrate;
a glass frit material interposed between the first substrate and the second substrate, and between the wiring and the second substrate, so that a first portion of the wiring is located inside of a sealed region defined by the first substrate, the second substrate, and the glass frit material, and a second portion of the wiring is located outside of the sealed region; and
a light-emitting element in the sealed region, the light-emitting element comprising a light-emitting layer interposed between a first electrode and a second electrode,
wherein a difference in linear thermal expansion coefficient between the electrically conductive material of the wiring and a material of the first substrate is 5 ppm/K or less over a temperature range of 0° C. to 500° C.,
wherein the low-resistance wiring comprises a first low-resistance wiring portion formed inside of the sealed region and connected to a pixel and a drive circuitry, and a second low-resistance wiring portion formed outside of the sealed region and connected to a flexible printed circuit,
wherein the first portion of the wiring is electrically connected to the first low-resistance wiring portion at a first connecting portion formed inside of the sealed region,
wherein the second portion of the wiring is electrically connected to the second low-resistance wiring portion at a second connecting portion formed outside of the sealed region, and
wherein, for a given length, the first low-resistance wiring portion and the second low-resistance wiring portion both have an electrical resistance lower than the wiring of the light-emitting device.

7. The light-emitting device according to claim 6,
wherein the difference in linear thermal expansion coefficient between the electrically conductive material of the wiring and the material of the first substrate is 2 ppm/K or less over the temperature range of 0° C. to 500° C.

8. The light-emitting device according to claim 6,
wherein the wiring is made of tungsten.

9. The light-emitting device according to claim 6, further comprising:
a semiconductor oxide layer interposed between the wiring and the glass frit material.

10. The light-emitting device according to claim 6, further comprising:
a buffer layer formed from the electrically conductive material between the glass frit material and the first substrate, the buffer layer being provided in an area overlapping with the glass fit material and in which the wiring is not provided.

11. The light-emitting device according to claim 6, further comprising:
a transistor comprising a source electrode and a drain electrode, one of the source electrode and the drain electrode being electrically connected to the light-emitting element.

12. The light-emitting device according to claim 6, further comprising:
a transistor comprising a source electrode and a drain electrode, one of the source electrode and the drain electrode being electrically connected to the light-emitting element,
wherein the low-resistance wiring and the source electrode each comprise a layer formed from a same conductive film.

13. The light-emitting device according to claim 6, further comprising:
a transistor comprising a gate electrode, a source electrode and a drain electrode, one of the source electrode and the drain electrode being electrically connected to the light-emitting element,
wherein the wiring and the gate electrode each comprise a layer formed from a same conductive film.

14. The light-emitting device according to claim 6, further comprising:
a transistor comprising a source electrode and a drain electrode, one of the source electrode and the drain electrode being electrically connected to the light-emitting element; and
an inorganic insulating film covering the transistor and interposed between the wiring and the glass frit material.

15. The light-emitting device according to claim 6, further comprising:
a transistor comprising a gate electrode, a source electrode and a drain electrode, one of the source electrode and the drain electrode being electrically connected to the light-emitting element,
wherein the wiring and the gate electrode each comprise a first layer formed from a same conductive film, and
wherein the low-resistance wiring and the source electrode each comprise a second layer formed from a same conductive film.

16. An electronic device comprising the light-emitting device according to claim 6.

17. The electronic apparatus according to claim 1,
wherein the wiring comprises a conductive material selected among molybdenum, titanium, iridium, chromium, tantalum, platinum, vanadium, and rhodium.

18. The electronic apparatus according to claim 1, further comprising:
an oxide layer interposed between the wiring and the glass frit material.

19. The electronic apparatus according to claim 1, further comprising:
an oxide layer interposed between the wiring and the glass frit material,
wherein the oxide layer is formed of an oxide of the electrically conductive material.

* * * * *